(12) United States Patent
Schwarz et al.

(10) Patent No.: US 11,114,411 B2
(45) Date of Patent: Sep. 7, 2021

(54) SEMICONDUCTOR CHIP TRANSFER METHOD AND TRANSFER TOOL

(71) Applicant: OSRAM Opto Semiconductors GmbH, Regensburg (DE)

(72) Inventors: Thomas Schwarz, Regensburg (DE); Jürgen Moosburger, Lappersdorf (DE); Frank Singer, Regenstauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/345,449

(22) PCT Filed: Oct. 25, 2017

(86) PCT No.: PCT/EP2017/077331
§ 371 (c)(1),
(2) Date: Apr. 26, 2019

(87) PCT Pub. No.: WO2018/077961
PCT Pub. Date: May 3, 2018

(65) Prior Publication Data
US 2019/0252350 A1     Aug. 15, 2019

(30) Foreign Application Priority Data
Oct. 28, 2016   (DE) .......................... 102016221281.8

(51) Int. Cl.
*H01L 23/00*     (2006.01)
*H01L 33/00*     (2010.01)
(Continued)

(52) U.S. Cl.
CPC .............. *H01L 24/97* (2013.01); *B65G 47/90* (2013.01); *H01L 21/67144* (2013.01);
(Continued)

(58) Field of Classification Search
CPC ............... H01L 24/97; H01L 21/67144; H01L 21/6836; H01L 2224/97
See application file for complete search history.

(56) References Cited

U.S. PATENT DOCUMENTS

2004/0154733 A1    8/2004  Morf
2007/0175024 A1    8/2007  Nakatani
(Continued)

FOREIGN PATENT DOCUMENTS

DE       44 46 489 C1    5/1996
JP       2005-033014     2/2005
(Continued)

OTHER PUBLICATIONS

Machine translation: JP2011096929-TADA et al. (Year: 2011).*
(Continued)

*Primary Examiner* — Natasha N Campbell
(74) *Attorney, Agent, or Firm* — DLA Piper LLP (US)

(57) ABSTRACT

A method of transferring semiconductor chips includes providing a transfer tool having a plurality of segments, each segment having a liquid receiving area; providing a plurality of semiconductor chips in a regular array on a source carrier; providing a target carrier; selectively arranging liquid drops on the liquid receiving areas of some of the segments; causing the transfer tool to approach the source carrier, each liquid drop contacting and wetting a semiconductor chip; lifting the transfer tool from the source carrier, wherein semiconductor chips wetted by liquid drops are lifted from the source carrier by the transfer tool; causing the target carrier by the transfer tool, to approach the semiconductor chips arranged on the transfer tool contacting the target carrier; and lifting the transfer tool from the target carrier, the semiconductor chips contacting the target carrier remaining on the target carrier

10 Claims, 13 Drawing Sheets

(51) Int. Cl.
  *H01L 21/67* (2006.01)
  *B65G 47/90* (2006.01)
  *H01L 21/683* (2006.01)

(52) U.S. Cl.
  CPC .......... *H01L 21/6836* (2013.01); *H01L 24/29* (2013.01); *H01L 24/32* (2013.01); *H01L 24/75* (2013.01); *H01L 24/83* (2013.01); *H01L 33/0095* (2013.01); *H01L 2224/291* (2013.01); *H01L 2224/2919* (2013.01); *H01L 2224/32225* (2013.01); *H01L 2224/7565* (2013.01); *H01L 2224/7598* (2013.01); *H01L 2224/75303* (2013.01); *H01L 2224/83192* (2013.01); *H01L 2224/95001* (2013.01); *H01L 2224/95136* (2013.01); *H01L 2224/95146* (2013.01); *H01L 2224/97* (2013.01)

(56) References Cited

U.S. PATENT DOCUMENTS

| | | | |
|---|---|---|---|
| 2012/0134065 A1* | 5/2012 | Furuya | H01L 21/6833 361/234 |
| 2012/0291950 A1 | 11/2012 | Sugiyama | |
| 2013/0300812 A1* | 11/2013 | Bibl | H01L 25/0753 347/159 |
| 2014/0061687 A1 | 3/2014 | Hu | |

FOREIGN PATENT DOCUMENTS

| | | | |
|---|---|---|---|
| JP | 2007-235123 A | 9/2007 |
| JP | 2011-096929 A | 5/2011 |
| JP | 2012-142525 A | 7/2012 |

OTHER PUBLICATIONS

Notice of Reasons for Refusal dated Jun. 18, 2020, of counterpart Japanese Application No. 2019-522702, along with an English translation.
Second Office Action dated May 21, 2021, of counterpart Chinese Application No. 201780067141.7, along with an English translation.
Decision of Refusal dated May 31, 2021, of counterpart Japanese Patent Application No. 2019-522702, along with an English translation.

* cited by examiner

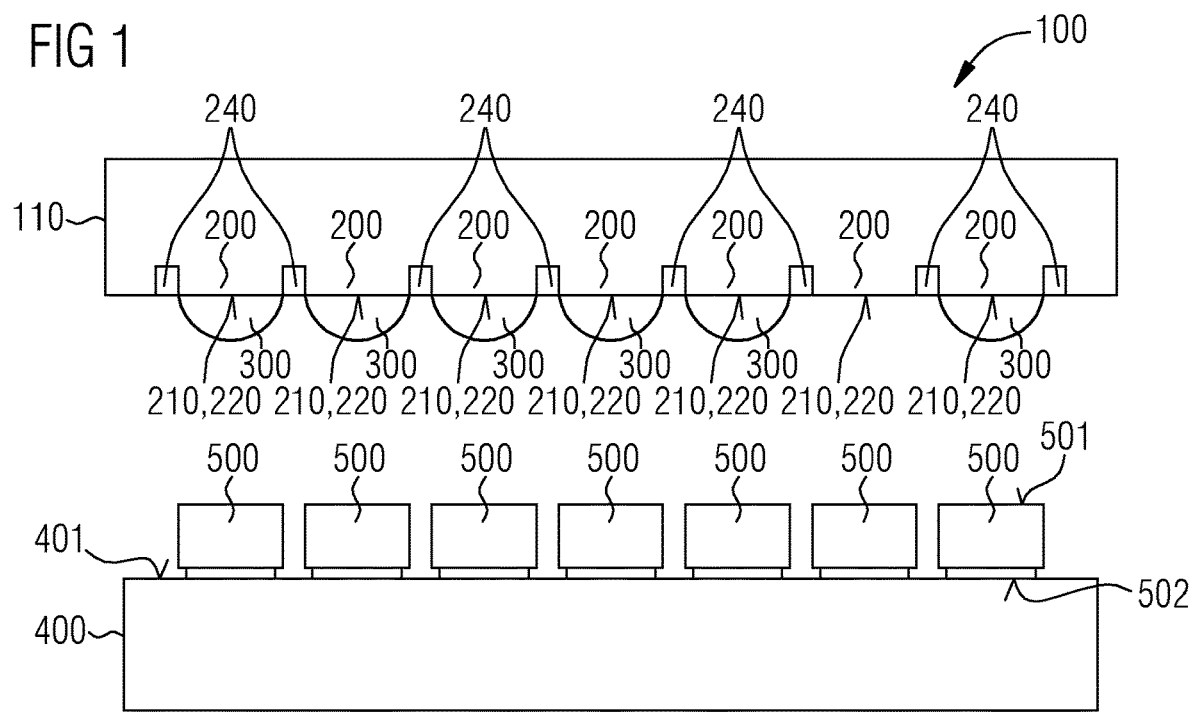
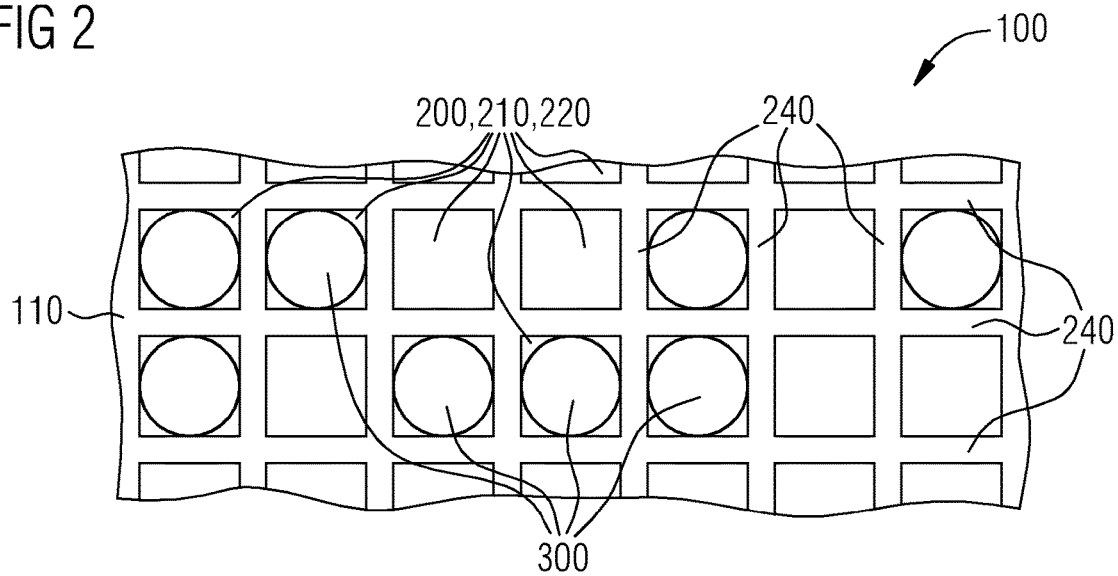

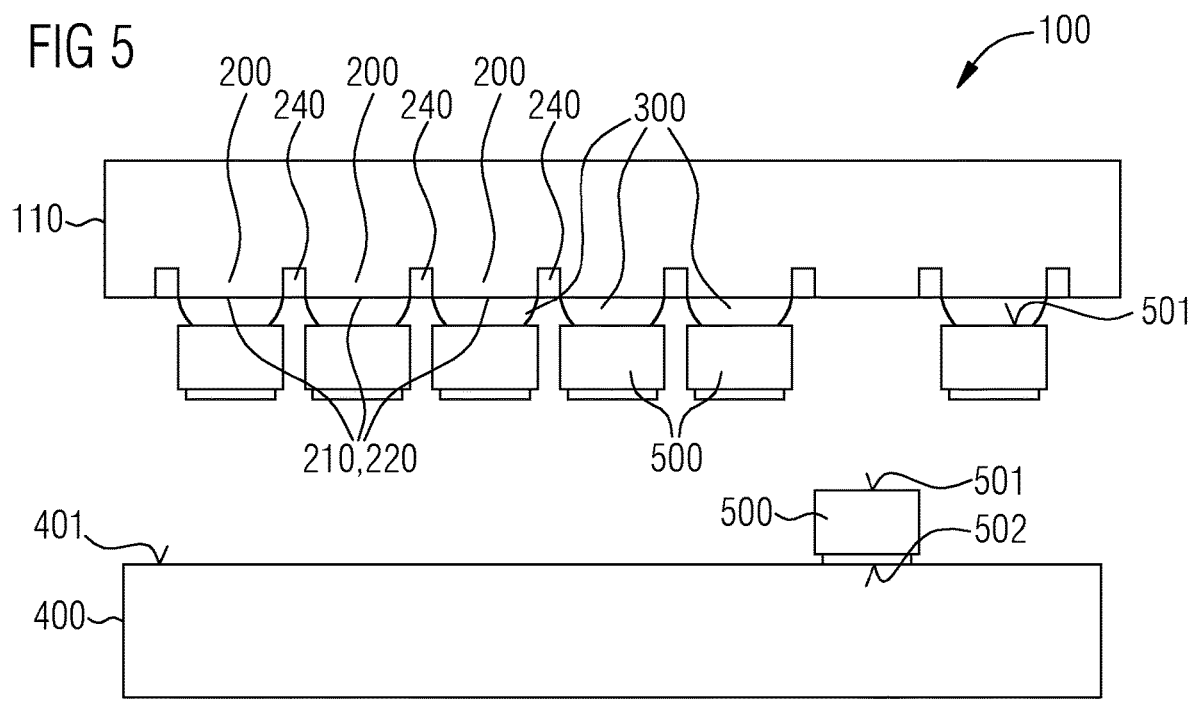
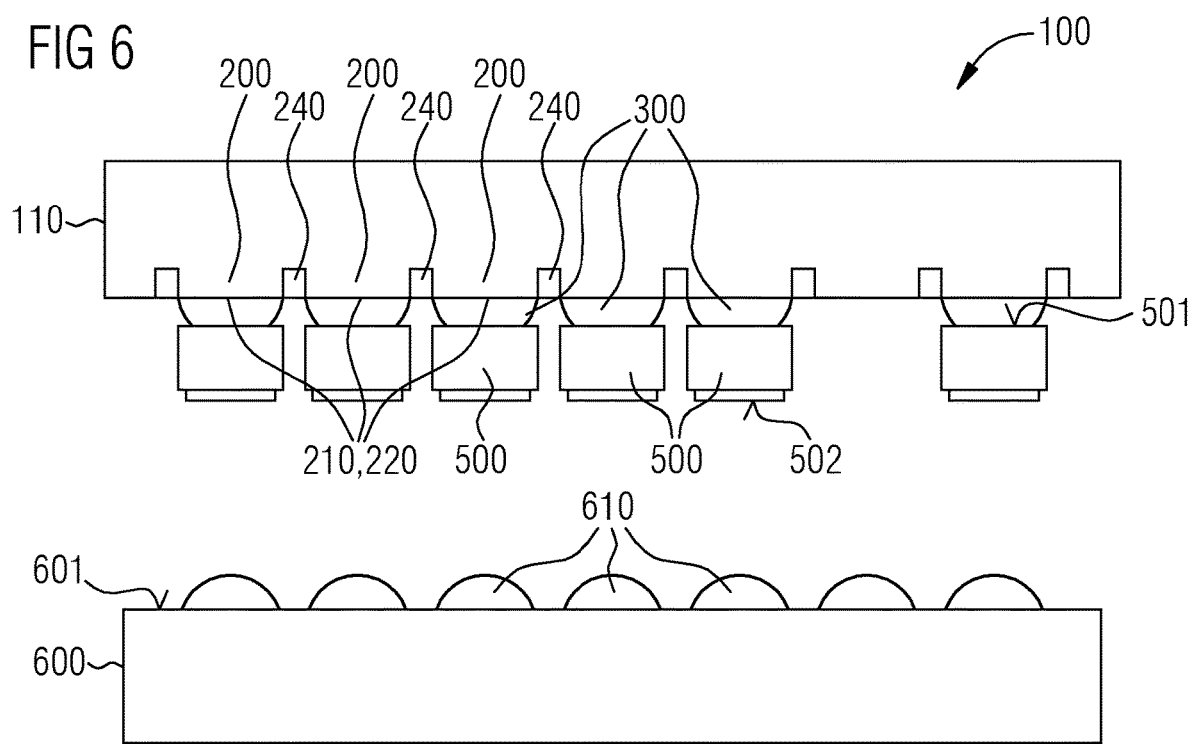

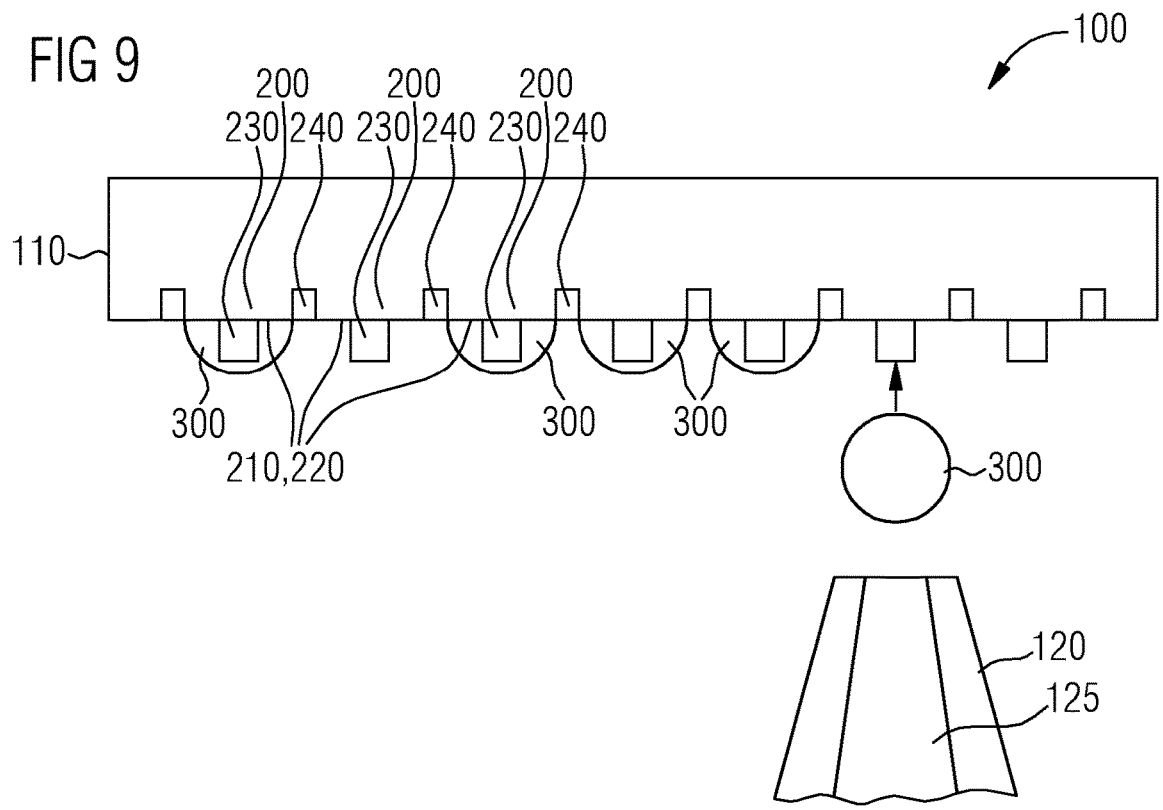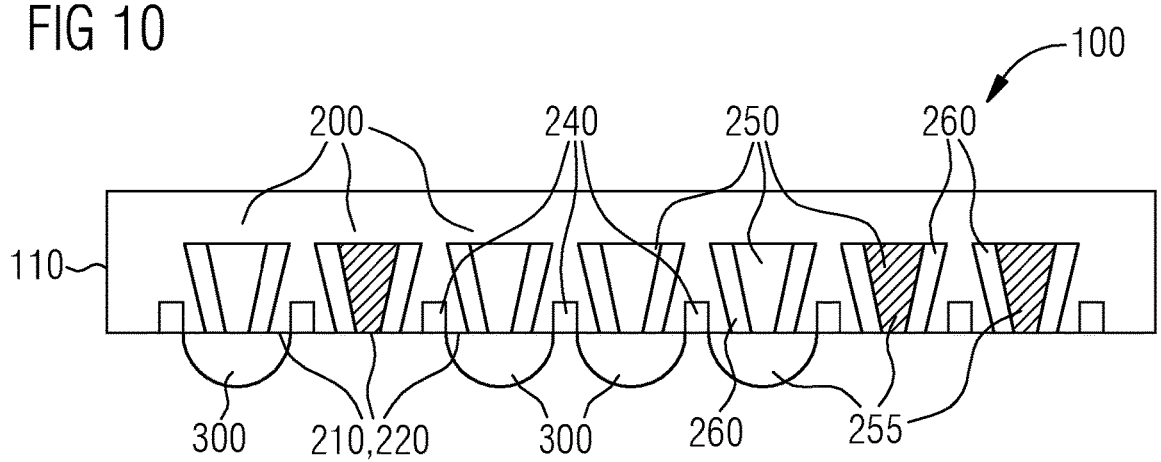

SEMICONDUCTOR CHIP TRANSFER METHOD AND TRANSFER TOOL

TECHNICAL FIELD

This disclosure relates to a method of transferring semiconductor chips and a transfer tool that transfers semiconductor chips.

BACKGROUND

Various methods are known for transferring semiconductor chips from a source carrier to a target carrier. Conventionally, semiconductor chips are transferred one after the other. This is particularly time-consuming when manufacturing devices with a large number of semiconductor chips. Therefore, there is an interest in methods and devices for the parallel transmission of several semiconductor chips simultaneously. US 2014/0061687 A1 describes such a method and device. The semiconductor chips are held on a transmission tool by electrostatic forces for transmission.

SUMMARY

We provide a method of transferring semiconductor chips including providing a transfer tool having a plurality of segments, each segment having a liquid receiving area; providing a plurality of semiconductor chips in a regular array on a source carrier; providing a target carrier; selectively arranging liquid drops on the liquid receiving areas of some of the segments; causing the transfer tool to approach the source carrier, each liquid drop contacting and wetting a semiconductor chip; lifting the transfer tool from the source carrier, wherein semiconductor chips wetted by liquid drops are lifted from the source carrier by the transfer tool; causing the target carrier by the transfer tool, to approach the semiconductor chips arranged on the transfer tool contacting the target carrier; and lifting the transfer tool from the target carrier, the semiconductor chips contacting the target carrier remaining on the target carrier.

We also provide a transfer tool that transfers semiconductor chips including a plurality of segments arranged in a regular row or matrix arrangement, wherein each segment has a liquid receiving area configured such that a liquid drop can be arranged on the liquid receiving area, wherein the transfer tool includes a print head adapted to shoot liquid drops onto the liquid receiving areas of the segments, and/or a charging device adapted to apply electric charge to the liquid receiving areas of the segments.

BRIEF DESCRIPTION OF THE DRAWINGS

FIG. 1 schematically shows a sectional side view of a segment carrier of a transfer tool and a source carrier with semiconductor chips arranged thereon.

FIG. 2 schematically shows a top view of segments of the segment carrier according to an example.

FIG. 5 schematically shows a sectional side view of the segment carrier and the source carrier after lifting the transfer tool from the source carrier.

FIG. 6 schematically shows a sectional side view of the segment carrier of the transfer tool and a target carrier.

FIG. 9 schematically shows a sectional side view of the transfer tool according to an example.

FIG. 10 schematically shows a sectional side view of the transfer tool according to another example.

Figure 3:
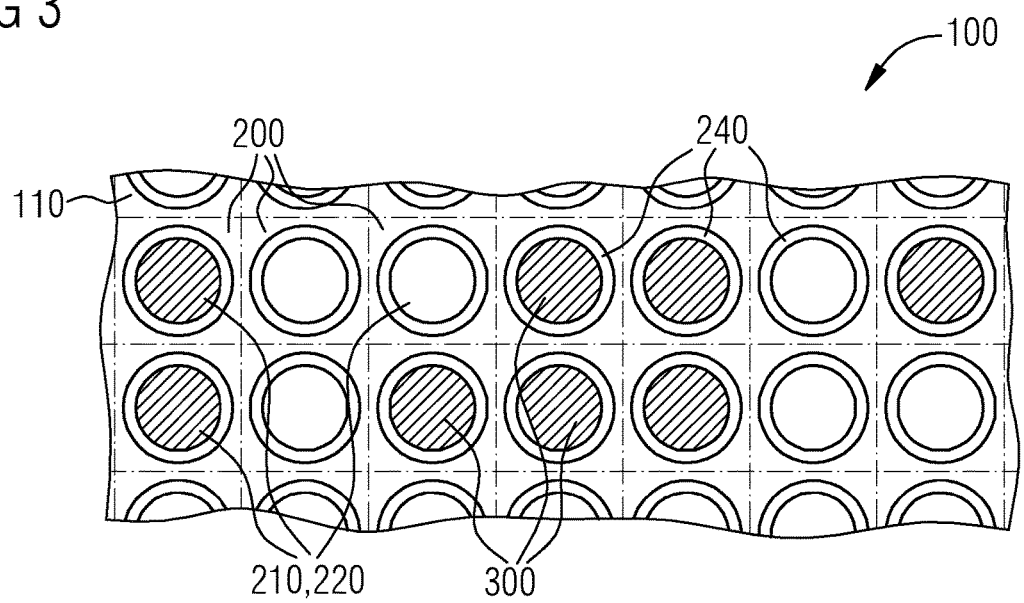
FIG. 3 schematically shows a top view of segments of the segment carrier according to a further example.

REFERENCE CHARACTER LIST 100 transfer tool
110 segment carrier
115 substrate
120 print head
125 nozzle
200 segment
210 liquid receiving area
220 liquid receiving surface
230 stamp
240 separating trench
250 liquid reservoir
255 liquid 260 fluid actuator
270 loading device
271 Segment loading device
272 charging unit
273 discharging unit
280 electrostatically chargeable film
290 liquid reservoir
295 liquid-conducting connection
300 liquid drops
400 source carrier
401 upper side
410 coating
420 structuring
430 chip receiving area
500 semiconductor chip
501 upper side
502 bottom side
600 target carrier
601 upper side
610 attachment means
700 temperature control device
710 heating device
711 heating element
712 thermal insulator
720 cross matrix circuit
721 row line
722 column line
723 dielectric
730 laser light source
731 laser beam
732 absorbent layer
740 deflection device
750 cooling device
751 Peltier element
752 heat pipe
800 film
810 adhesive film
820 carrier film
830 further adhesive film
840 hard carrier
850 water

DETAILED DESCRIPTION

Our method of transferring semiconductor chips comprises the steps of providing a transfer tool having a plurality of segments, each segment having a liquid receiving area, providing a plurality of semiconductor chips in a regular array on a source carrier, providing a target carrier, selectively locating drops of liquid at the liquid receiving areas of at least some of the segments, approaching the transfer tool to the source carrier, each liquid drop contacting and wetting a semiconductor chip, to lift the transfer tool from the source carrier, wherein semiconductor chips wetted by liquid drops are lifted from the source carrier with the transfer tool, to approach the transfer tool to the target carrier, wherein the semiconductor chips arranged on the transfer tool contact the target carrier, and to lift the transfer tool from the target carrier, wherein the semiconductor chips contacting the target carrier remain on the target carrier.

Advantageously, the method enables the simultaneous transfer of several semiconductor chips. The method allows many semiconductor chips to be transferred cost-effectively from a source carrier to a target carrier in a short time.

The advantage of the method is that the semiconductor chips are not exposed to any electrostatic stress during their transfer, which means that there is only a slight risk of damage to the semiconductor chips by electrostatic discharges with this method.

A particular advantage of this method of transferring semiconductor chips is that it enables selective transfer of selected semiconductor chips. This means that by the method not all semiconductor chips provided on the source carrier necessarily have to be transferred. Instead, the method makes it possible to transfer only an arbitrarily selectable part of the semiconductor chips arranged on the source carrier. This makes it possible, for example, to transfer only semiconductor chips known to be functional and to leave semiconductor chips known to be defective on the source carrier. The selected part of the semiconductor chips, for example, all functional semiconductor chips, can be transferred simultaneously from the source carrier to the target carrier in a time-saving manner then.

The semiconductor chips to be selectively transferred from the source carrier to the target carrier are selected by the selective arrangement of liquid drops at the liquid receiving areas of the segments. Only at the segments where liquid drops are arranged are semiconductor chips subsequently transferred. If a semiconductor chip should not be transferred, no liquid drop is arranged on the segment of the transfer tool assigned to this semiconductor chip.

The liquid drops may be arranged at least partially in parallel. The advantage of this is that the method of transferring semiconductor chips can be carried out particularly quickly and thus also cost-effectively.

The liquid drops may be arranged at the liquid receiving areas by shooting. The liquid drops can, for example, be sprayed with a print head. The print head can be movable. Advantageously, the method can allow several drops of liquid to be applied simultaneously, allowing the drops of liquid to be arranged at the liquid receiving areas in a short time.

Each segment may connect to a liquid reservoir. The liquid drop is arranged in each segment by moving liquid from the liquid reservoir to the liquid receiving area. Advantageously, the method also enables the parallel arrangement of liquid drops on several segments at the same time, which allows the method to be carried out at high speed.

Selectively arranging the liquid drops may comprise steps of selectively applying electric charge to the liquid receiving areas of at least some of the segments and immersing the liquid receiving areas in a polar liquid. After immersing the liquid receiving areas in the polar liquid, liquid drops remain either only on the previously charged liquid receiving areas or only on the previously uncharged liquid receiving areas. It is advantageous that the selective application of the electrical charge to the liquid receiving areas can be carried out simultaneously for all segments during the method so that the selective arrangement of the liquid drops can be carried out in a short time.

Selectively applying electrical charge to the liquid receiving areas of at least some of the segments may comprise steps of applying electrical charge to the liquid receiving areas of all segments of the transfer tool and selectively removing the charge from some of the segments. Advantageously, the method can be implemented simply and cost-effectively.

The charge may be selectively removed with a laser beam. The advantage of the method is that the selective removal of the charge can be carried out very quickly and with high accuracy.

Selectively arranging the liquid drops may comprise steps of applying a solid to the liquid receiving areas of all segments of the transfer tool and selectively liquefying the solid at at least some of the segments to form a respective liquid drop. Advantageously, the method is particularly simple and low-cost to carry out. Selective liquefaction of the solid can be carried out in parallel for at least some of the segments, making the method particularly fast. The method may also make it possible to reuse the solid located at the liquid receiving areas by liquefying and reconsolidating the solid several times in succession to form liquid drops at the liquid receiving areas of the segments and then remove the liquid drops.

Selectively arranging the liquid drops may comprise a step of selectively cooling the liquid receiving areas of at least some of the segments below a dew point, whereby liquid drops are formed by condensation at the liquid receiving areas of the cooled segments. Advantageously, the arrangement of the liquid drops at the liquid receiving areas of at least some of the segments is also parallel in the method and therefore particularly fast.

After the transfer tool has approached the source carrier, a further step may be carried out to cool the liquid receiving areas of at least the segments on which liquid drops have been arranged below a freezing point, wherein the liquid drops at least partially freeze. Furthermore, after the transfer tool approaches the target carrier, a further step is performed to heat the liquid receiving areas of at least the segments on which liquid drops have been arranged above the freezing point, wherein the liquid drops at least partially thaw. Advantageously, the semiconductor chips wetted by the liquid drops are held particularly reliably on the segments of the transfer tool by the at least partial freezing of the liquid drops, whereby the lifting of the semiconductor chips from the source carrier and the transfer of the semiconductor chips from the source carrier to the target carrier can take place particularly reliably with the method. The method is also advantageously feasible if there is a high adhesive force between the semiconductor chips arranged on the source carrier and the source carrier. The subsequent at least partial thawing of the liquid drops releases the semiconductor chips arranged on the target carrier after the transfer of the semiconductor chips, wherein the transfer tool can be lifted off the target carrier and the semiconductor chips coming into contact with the target carrier remain on the target carrier.

The liquid drops may be water, a solvent, a hydrocarbon, a silicone, siloxane, a resin or a wax. Advantageously, these materials have proven to be suitable for carrying out the method.

Before the transfer tool may be lifted off the target carrier, a step is performed to remove the liquid drops. Advantageously, removing the liquid drops reduces or completely eliminates adhesion of the semiconductor chips to the liquid receiving areas of the segments of the transfer tool, allowing the transfer tool to be easily lifted off without also lifting the semiconductor chips from the target carrier.

The liquid drops may be removed by adding heat to evaporate the liquid drops. The advantage is that the method is particularly simple and reproducible.

The target carrier may be provided with an attachment means arranged on it. The semiconductor chips arranged on the transfer tool contact the attachment means as the transfer tool approaches the target carrier. The attachment means can be a solder or an adhesive, for example. The advantage of the method is that the semiconductor chips in contact with the attachment means adhere reliably to the target carrier, which makes it easier to lift the transfer tool off the target carrier without lifting the semiconductor chips together with the transfer tool off the target carrier.

The semiconductor chips may adhere to the source carrier with an adhesive force of less than 0.1 N/20 mm$^2$. It is advantageous that in this example it is particularly easy to remove the semiconductor chips from the source carrier using the transfer tool.

The semiconductor chips may adhere to the target carrier with an adhesive force of more than 0.1 N/20 mm$^2$, preferably with an adhesive force between 0.5 N/20 mm$^2$ and 5 N/20 mm$^2$. Advantageously, the semiconductor chips that contact the target carrier adhere reliably to the target carrier, which makes it easier to subsequently lift the transfer tool off the target carrier without lifting the semiconductor chips together with the transfer tool.

Providing the semiconductor chips on the source carrier may comprise steps of providing a plurality of semiconductor chips in a regular array on a foil, providing the source carrier, placing the foil having the array of semiconductor chips on the source carrier such that the semiconductor chips face the source carrier, to cool the source carrier below the freezing point of water, wherein water condenses and freezes on the source carrier, wherein the semiconductor chips are fixed on the source carrier, to remove the film from the semiconductor chips, wherein the semiconductor chips remain on the source carrier, and to heat the source carrier, wherein water arranged on the source carrier melts and evaporates. Advantageously, the method enables the semiconductor chips to be transferred from the foil to the source carrier. The semiconductor chips can adhere to the film with a greater adhesive force than to the source carrier. The transfer of the semiconductor chips is possible independently of the concrete technology of the semiconductor chips, i.e. for different types of semiconductor chips.

The film may be pulled off at an acute angle. Advantageously, particularly large peeling forces act between the film and the semiconductor chips, making it easy to peel off the film.

The film may comprise a carrier film and an adhesive film disposed on the carrier film. The semiconductor chips are arranged on the adhesive film. Advantageously, the film is therefore easy to produce and inexpensive to obtain.

The source carrier may be provided with a structured top side with separate chip receiving areas. The foil with the arrangement of semiconductor chips is placed on the source carrier such that each semiconductor chip is arranged on its own chip receiving area. The advantage of the structured upper side of the spring support is that during the defrosting of the water, water drops are formed at the chip receiving areas that are separated from each other. This prevents the semiconductor chips from blurring on the source carrier. The drops formed at the chip receiving areas on the top of the source carrier can even cause automatic centering of the semiconductor chips on the respective chip receiving areas.

A transfer tool that transfers semiconductor chips comprises a plurality of segments arranged in a regular row or matrix array. Each of the segments has a liquid receiving area such that a liquid drop can be arranged on the liquid receiving area.

Advantageously, this transfer tool enables a selective parallel transfer of a plurality of semiconductor chips from a source carrier to a target carrier. The transfer of the semiconductor chips takes place by wetting the semiconductor chips with a liquid drop arranged on a liquid receiving area of a segment of the transfer tool. By selectively arranging liquid drops at the liquid receiving areas of only some segments of the transfer tool, it is possible to selectively transfer only some semiconductor chips.

The transfer tool advantageously allows a transfer of semiconductor chips in which the semiconductor chips are not exposed to electrostatic forces. Thus, the transfer tool enables a transfer of semiconductor chips where there is only a low risk of damage to the semiconductor chips by electrostatic discharges.

Each liquid receiving area may include a liquid receiving surface. The liquid receiving surfaces of all segments are arranged in a common plane. Advantageously, this makes it possible to pick up several semiconductor chips arranged in a row or matrix arrangement simultaneously with the transfer tool to transfer them from a source carrier to a target carrier.

The liquid receiving surfaces may be delimited by separating trenches. Advantageously, this facilitates formation of separate liquid drops on the liquid receiving surfaces of the individual segments, enabling the exact selective pickup of desired semiconductor chips by the transfer tool. The separation trenches can prevent an unwanted confluence of adjacent liquid drops.

The liquid receiving surfaces bounded by separating trenches may be rectangular or circular disc-shaped. Rectangular liquid receiving surfaces are particularly suitable for transferring rectangular semiconductor chips. Circular disc-shaped liquid receiving surfaces are advantageously suitable for the arrangement of liquid drops.

Each liquid receiving area may have a stamp located on the liquid receiving surface. These stamps can advantageously help center liquid drops located at the liquid receiving areas on the liquid receiving areas. The stamps arranged on the liquid receiving surfaces of the liquid receiving areas of the segments of the transfer tool can also be used to break semiconductor chips from an anchorage to a substrate wafer. The stamps can also be used to hold semiconductor chips picked up at the segments of the transfer tool by Van-der-Waals forces.

The stamps may be centrally arranged on the liquid receiving surfaces. Advantageously, liquid drops arranged at the liquid receiving areas of the segments of the transfer tool are thus centered particularly effectively over the liquid receiving surfaces of the liquid receiving areas.

The stamps may be elastic. Advantageously, this reduces the risk that semiconductor chips are damaged by the stamps during the transfer of semiconductor chips using the transfer tool.

The stamps may each have a microporous material. Each stamp has a liquid-conducting connection to a liquid reservoir. With this transfer tool, liquid can pass through each segment to the liquid receiving area of the segment through the liquid conducting compound and the microporous material stamp to form a liquid drop. Advantageously, liquid drops can be easily arranged at the liquid receiving areas of the segments with this transfer tool.

The transfer tool may have a temperature control device to bring the liquid receiving areas of different segments to different temperatures. The temperature control device can therefore be used to selectively heat or cool segments. This allows liquid drops to be selectively arranged on individual segments, liquid drops to be selectively prevented from being arranged on individual segments of the transfer tool or liquid drops to be selectively removed from individual segments.

Each segment may have a heating element to heat the liquid receiving area of the respective segment. The heating elements of the different segments can be controlled independently of each other. It is advantageous that individual segments can be heated independently of each other to prevent liquid drops from accumulating on the heated segments or to remove liquid drops from the heated segments.

The heating elements of the different segments can be controlled via a cross matrix circuit. Advantageously, this enables each segment to be accessed independently of the other segments. Even in a large number of existing segments, only a limited number of connecting cables are required, which means that the transfer tool can advantageously have a simple construction.

The transfer tool may comprise a laser light source that generates a laser beam and a deflection device adapted to selectively deflect the laser beam to individual segments. It is thus advantageously possible to selectively heat individual segments by the laser beam to prevent an arrangement of liquid drops on the segments or remove liquid drops arranged on the segments.

The transfer tool may have a cooling device that cools the liquid receiving areas of the segments. Advantageously, this makes it possible to cool the segments of the transfer tool to such an extent that liquid drops form on the segments due to condensing moisture.

The cooling device may have a Peltier element. Advantageously, the cooling device enables effective and efficient cooling of the segments of the transfer tool.

The cooling device may have a heat pipe. Advantageously, this makes it possible to dissipate heat from the segments of the transfer tool via the heat pipe to cool the segments of the transfer tool.

The transfer tool may have a printhead adapted to shoot liquid drops onto the liquid receiving areas of the segments. The print head can be movable or immovable. Advantageously, the printhead may allow multiple drops of liquid to be shot simultaneously onto the liquid receiving areas of multiple segments of the transfer tool. This makes it advantageously possible to arrange liquid drops at the liquid receiving areas of the segments of the transfer tool in a very short time.

Each segment may comprise a liquid reservoir and a fluid actuator adapted to move liquid from the liquid reservoir of the respective segment to the liquid receiving area of the respective segment to locate a drop of liquid at the liquid receiving area. Advantageously, it is possible to arrange liquid drops at the liquid receiving areas of several segments at the same time. This allows liquid drops to be placed very quickly on the liquid receiving areas of the segments of this transfer tool.

The fluid actuator of each segment may be adapted to move fluid from the fluid receiving area of the respective segment to the fluid reservoir of the respective segment to remove a drop of fluid from the fluid receiving area. The advantage of this is that the respective liquid can be used several times, which makes the transfer tool particularly easy to use and requires little maintenance.

The transfer tool may comprise a charging device adapted to apply electric charge to the liquid receiving areas of the segments. Advantageously, charge applied to the liquid receiving areas of the segments can be used to arrange liquid drops at the liquid receiving areas of the segments. This can be done, for example, by immersing the liquid receiving areas of the segments with the applied electrical charge in a polar liquid.

Each segment may comprise a segment charging device adapted to apply electric charge to the liquid receiving area of the respective segment. The segment loading devices of the different segments can be controlled independently of each other. Advantageously, with this transfer tool it is thus possible to selectively apply electrical charge only to the liquid receiving areas of selected segments. This makes it possible to arrange liquid drops only at liquid receiving areas of the selected segments. This in turn makes it possible to selectively transfer only selected semiconductor chips with the transfer tool.

The loading device may have a charging unit to charge the liquid receiving areas of the segments. The loading device also includes a discharging unit to selectively unload fluid receiving areas of individual segments. For example, the discharging unit may include a laser device that generates a laser beam to selectively discharge fluid receiving areas. Advantageously, it is also possible with this transfer tool to electrically charge only the liquid absorption areas of individual, selected segments and thus arrange liquid drops only at the liquid absorption areas of the selected segments. Thus, this transfer tool also makes it possible to selectively transfer only single, selected semiconductor chips.

The characteristics, features and advantages described above and the way in which they are achieved become clearer and more comprehensible in the context of the following description of examples explained in more detail in the context of the drawings.

FIG. 1 shows a schematically sectional side view of a part of a transfer tool 100. The transfer tool 100 is provided to selectively transfer semiconductor chips in parallel from a source carrier to a target carrier. The transfer tool 100 enables parallel transmission of several semiconductor chips at the same time. In addition, the transfer tool 100 enables the selective selection of the semiconductor chips to be transferred rather than necessarily transferring all the semiconductor chips present on a source carrier.

FIG. 1 also shows a schematically sectional side view of a part of a source carrier 400. Semiconductor chips 500 are arranged on an upper side 401 of the source carrier 400. The semiconductor chips 500 can be present in a regular one- or two-dimensional arrangement, for example, in a two-dimensional matrix arrangement. All lattice locations of the regular arrangement can be occupied by semiconductor chips 500. However, individual semiconductor chips 500 may also be missing so that the regular one- or two-dimensional arrangement of the semiconductor chips 500 has gaps.

The semiconductor chips 500 arranged on the upper side 401 of the source carrier 400 can be spaced apart from each other. The semiconductor chips 500 arranged on the upper side 401 of the source carrier 400 can, however, also be interconnected, for example, as a wafer composite. In this example, the wafer network can have predetermined breaking points at the boundaries between the individual semiconductor chips 500 that can be in the form of saw marks, for example.

Each of the semiconductor chips 500 provided at the top 401 of the source carrier 400 has a top 501 and a bottom 502 opposite the top 501. The semiconductor chips 500 are arranged on the upper side 401 of the source carrier 400 such that the lower sides 502 of the semiconductor chips 500 face the upper side 401 of the source carrier 400.

The semiconductor chips 500 can be optoelectronic semiconductor chips or other semiconductor chips. For example, the semiconductor chips 500 can be light emitting diode chips (LED chips). In this example, the top sides 501 of the semiconductor chips 500 can be radiation emission sides of the semiconductor chips 500 provided as LED chips.

The source carrier 400 can be a low-adhesion carrier, i.e. a carrier with only low adhesive forces between the semiconductor chips 500 arranged on the upper side 401 of the source carrier 400 and the source carrier 400. These adhesive forces can be less than 0.1 N/20 mm$^2$, for example. The upper side 401 of the source carrier 400 may, for example, have a slightly sticky material, such as silicone or polydimethylsiloxane (PDMS). The upper side of the source carrier 400 can also be formed by a foamed Nitto Thermal Release Tape. The top side 401 of the source carrier 400 can also be chip finely structured to reduce the adhesive forces acting between the semiconductor chips 500 and the top side 401 of the source carrier 400. The semiconductor chips 500 can also be attached to the upper side 401 of the source carrier 400 by easily detachable anchor structures.

The transfer tool 100 comprises a segment carrier 110. The segment carrier 110 has a plurality of segments arranged in a regular one- or two-dimensional arrangement, i.e. in a row or matrix arrangement. The grid size of the regular arrangement of the segments 200 corresponds to the grid size of the semiconductor chips 500 provided on the upper side 401 of the source carrier 400. The phrase "the grid size of the segments 200 corresponds to the grid size of the semiconductor chips 500 provided on the upper side 401 of the source carrier 400" shall also include examples in which the grid size of the segments 200 corresponds to a multiple of the grid size of the semiconductor chips 500 provided. In the examples in which the pitch of the segments 200 corresponds to a multiple of the pitch of the semiconductor chips 500 provided, an expansion of the chip arrangement can be achieved in addition to a selection of the semiconductor chips. Thus, each semiconductor chip 500 provided at the upper side 401 of the source carrier is associated with one of the segments 200 of the segment carrier 110 of the transfer tool 100. For example, 100 or more segments 200 can be arranged on a segment carrier. In some examples, 1000 or more segments 200 can be arranged on a segment carrier.

Each 200 segment located on the segment carrier 110 has a liquid receiving area 210 with a substantially flat liquid receiving surface 220. The liquid receiving areas 210 of all segments 200 of the segment carrier 110 are formed on a common surface of the segment carrier 110. As a result, the liquid receiving surfaces 220 of all segments 200 are arranged in a common plane. The liquid absorption areas 210, for example, can be smaller than 1 mm$^2$. In some examples, the liquid receiving areas 210 can also be less than or equal to 0.1 mm$^2$.

In the example shown in FIG. 1, the liquid receiving surfaces 220 of the liquid receiving areas 210 of the segments 200 of the segment carrier 110 are delimited and separated from each other by separating trenches 240. The separating trenches 240 are formed as grooves. The separating trenches 240 may have been created, for example, by sawing methods or a combination of a photographic technique and an etching method. FIGS. 2 and 3 show schematic views of the liquid receiving surfaces 220 of some segments of the segment carrier 110 in two examples. The segments 200 are each arranged in a regular, two-dimensional matrix arrangement. In the example of FIG. 2, the liquid receiving surfaces 220 of the segments 200 delimited by the separating trenches 240 are rectangular. In the example in FIG. 3, the liquid receiving surfaces 220 of the segments 200 delimited by the separating trenches 240 are circular disc-shaped. The course of the separation trenches 240 and the shape of the liquid receiving surfaces 220 can also be different. The separation trenches 240 can form a wetting transition. The term wetting transition is generally intended to denote a difference in wettability. In addition to or as an alternative to geometric structures, a wetting transition can also be created by using different materials.

With a simplified example, the separation trenches 240 can also be omitted.

Exactly one of the segments 200 of segment carrier 110 of transfer tool 100 is assigned to each semiconductor chip 500 provided at the upper side 401 of source carrier 400. The segment carrier 110 of the transfer tool 100 has been arranged over the upper side 401 of the source carrier 400 and aligned such that each segment 200 associated with a semiconductor chip 500 is respectively arranged in a perpendicular direction over the semiconductor chip 500. The alignment of the segment carrier 110 of the transfer tool 100 may, for example, have been carried out using alignment marks arranged on the segment carrier 110 and/or on the source carrier 400. Adjustment marks may be located, for example, on the side of the segment carrier 110 having the liquid receiving areas 210 or on the side of the segment carrier 110 opposite the liquid receiving areas 210. The segment carrier 110 may be transparent if necessary to permit recognition of the adjustment marks through the segment carrier 110.

FIGS. 1 to 3 show that liquid drops 300 have been arranged at the liquid receiving areas 210 of at least some of the segments 200 of the segment carrier 110 of the transfer tool 100. Liquid drops 300 may have been selectively disposed only at the liquid receiving areas 210 of selected segments 200 or at the liquid receiving areas 210 of all segments 200 of the segment carrier 110. Liquid drops 300 have been disposed only at those segments 200 each associated with a semiconductor chip 500 to be subsequently transferred with the transfer tool 100. For semiconductor chips 500 not transferred with the transfer tool 100 but are to remain on the source carrier 400, no liquid drop 300 was arranged on the corresponding segment 200 of the segment carrier 110 of the transfer tool 100.

The selection, which of the semiconductor chips 500 provided on the upper side 401 of the source carrier 400 are to be transferred with the transfer tool 100, and thus the selection, on which segments 200 of the segment carrier 110 of the transfer tool 100 liquid drops 300 have been arranged, can be made, for example, on the basis of a previous characterization of the semiconductor chips 500. For example, the selection may have been made so that only semiconductor chips 500 characterized as functional or only semiconductor chips 500 characterized as having a desired property are transferred through the transfer tool 100, while all other semiconductor chips 500 remain on the source carrier 400. It is also possible, for example, to select only those semiconductor chips 500 for transfer with the transfer tool 100 whose positions in the grid correspond to the regular one- or two-dimensional arrangement of the desired positions of the semiconductor chips 500 on a target carrier. In each example, the selection of the semiconductor chips 500 to be transferred to the source carrier 400 is transferred to the segment carrier 110 of the transfer tool 100 by arranging liquid drops 300 only on the segments 200 associated with the selected semiconductor chips 500.

The liquid drops 300 each wet the liquid receiving surfaces 220 of the liquid receiving areas 210 of the segments 200 of the segment carrier 110 of the transfer tool 100. The size of the liquid drops 300 is such that liquid drops 300 arranged on adjacent segments 200 do not merge with each other. Each 300 liquid drop is thus limited to the liquid receiving area 210 of its respective segment 200. The separation trenches 240 located between the liquid receiving surfaces 220 of the segments 200 can help limit the liquid drops 300 to the liquid receiving surfaces 220 of the segments 200. A particularly effective limitation can be achieved with the circular disc-shaped liquid receiving surfaces 220 of the example shown in FIG. 3.

Various methods and devices to arrange the liquid drops 300 at the liquid receiving areas 210 of the segments 200 of the segment carrier 110 of the transfer tool 100 are explained below. It is useful if the liquid drops 300 are arranged at least partially in parallel, i.e. liquid drops 300 are arranged simultaneously at the liquid receiving areas 210 of several segments 200. Before arranging the liquid drops 300, a method step can be performed to clean the liquid receiving areas 210 of the segments 200 of the segment carrier 110.

Figure 4:
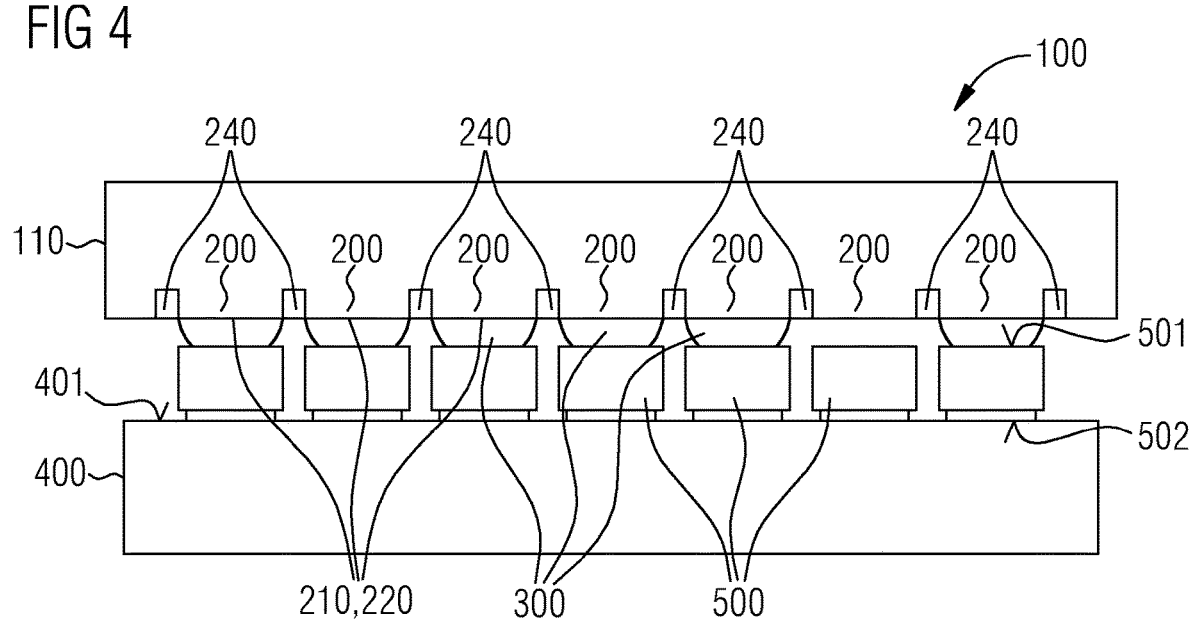
FIG. 4 schematically shows a sectional side view of the segment carrier and the source carrier after the transfer tool has approached the source carrier.

FIG. 4 shows a schematically sectional side view of the segment carrier 110 of the transfer tool 100 and the source carrier 400 with the semiconductor chips 500 provided on it in a processing status following in time the representation of FIG. 1.

The segment carrier 110 of the transfer tool 100 has been approached to the source carrier 400 such that the liquid drops 300 arranged at the liquid receiving areas 210 of the segments 200 of the segment carrier 110 have come into contact with the upper sides 501 of the semiconductor chips 500 arranged at the upper side 401 of the source carrier 400 and have wetted them. The segment carrier 110 has been approached to the upper side 401 of the source carrier 400 such that each segment 200 of the segment carrier 110 is arranged above the semiconductor chip 500 assigned to the respective segment 200 at the upper side 401 of the source carrier 400. At each segment 200, at whose liquid receiving area 210 a liquid drop 300 has been arranged, the liquid drop wets the upper side 501 of the semiconductor chip 500 assigned to the respective segment 200. In addition, the liquid drops 300 wets the liquid receiving areas 210 of the respective segments 200. At segments 200 of the segment carrier 110, at which no liquid drops 300 have been arranged, correspondingly no wetting of the assigned semiconductor chip 500 has taken place.

FIG. 5 shows a schematically sectional side view of the segment carrier 110 of the transfer tool 100, the source carrier 400 and the semiconductor chips 500 in a processing status following the representation of FIG. 4.

The segment carrier 110 of the transfer tool 100 has been lifted from the source carrier 400. All semiconductor chips 500 previously wetted by liquid drops of 300 have been lifted from the source carrier 400 with the segment carrier 110 of the transfer tool 100 and continue to adhere to the liquid drops 300 arranged on the segments 200. The semiconductor chips 500 not previously wetted by drops of liquid 300 have remained on the upper side 401 of the source carrier 400.

The wetting forces acting between the liquid drops 300 and the semiconductor chips 500, i.e. the adhesive forces acting between the liquid drops 300 and the semiconductor chips 500 due to the wetting of the top surfaces 501 of the semiconductor chips 500 by the liquid drops 300 between the liquid drops 300 and the semiconductor chips 500, as well as the wetting forces acting between the liquid drops 300 and the liquid absorption areas 210 of the segments 200, are greater than the adhesive forces previously acting between the semiconductor chips 500 and the upper side 401 of the source carrier 400. As a result, the semiconductor chips 500 wetted by liquid drops of 300 remained on the segment carrier 110 during the lifting off of the segment carrier 110 from the source carrier 400 and were lifted off from the source carrier 400 with the segment carrier 110.

FIG. 6 shows a schematically sectional side view of the segment carrier 110 of the transfer tool 100 with the semiconductor chips 500 adhering to it in a processing status following the representation of FIG. 5. In addition, FIG. 6 shows a schematically sectional side view of a part of a target carrier 600.

The target carrier 600 serves as the target for the semiconductor chips 500 transferred with the transfer tool 100. The target carrier 600 can be provided as a wafer, a printed circuit board or another substrate, for example. The target carrier 600 can form the final target of the semiconductor chips 500 transferred with the transfer tool 100. In this example, the transfer of the semiconductor chips 500 with the transfer tool 100 can be described as mounting the target carrier 600. However, the target carrier 600 can also form a temporary carrier on which the semiconductor chips 500 are only temporarily arranged in order to subsequently transfer them to another location.

The target carrier 600 has an upper side 601 on which the semiconductor chips 500 transferred with the transfer tool 100 are to be arranged. In the example shown in FIG. 6, a attachment means 610 has been previously arranged on the upper side 601 of the target carrier 600 that fastens the semiconductor chips 500 subsequently transferred to the target carrier 600. For example, the 610 attachment means may be a solder or adhesive. The attachment means 610 can be placed flat on the upper side 601 of the target carrier 600. However, an attachment means 610 may also be arranged in the form of individual portions on the upper side 601 of target carrier 600 as shown in FIG. 6, with a separate portion of attachment means 610 being provided for each semiconductor chip 500 to be transferred to target carrier 600. The portions of the attachment means 610 are provided in a regular one- or two-dimensional arrangement on the upper side 601 of the target carrier 600, the grid dimension of which corresponds to the grid dimension of the semiconductor chips 500 transferred to the target carrier 600. However, a simplified example of the 601 attachment means can also be dispensed with completely.

The segment carrier 110 of the transfer tool 100 is aligned over the upper side 601 of the target carrier 600 such that each semiconductor chip 500 held on a segment 200 of the segment carrier 110 is positioned over its target position on the upper side 601 of the target carrier 600. The alignment of the segment carrier 110 of the transfer tool 100 can, for example, be carried out by optical alignment. For example, adjustment marks arranged on the upper side 601 of the target carrier 600 and/or adjustment marks arranged on the transfer tool 100 can be used.

Figure 7:
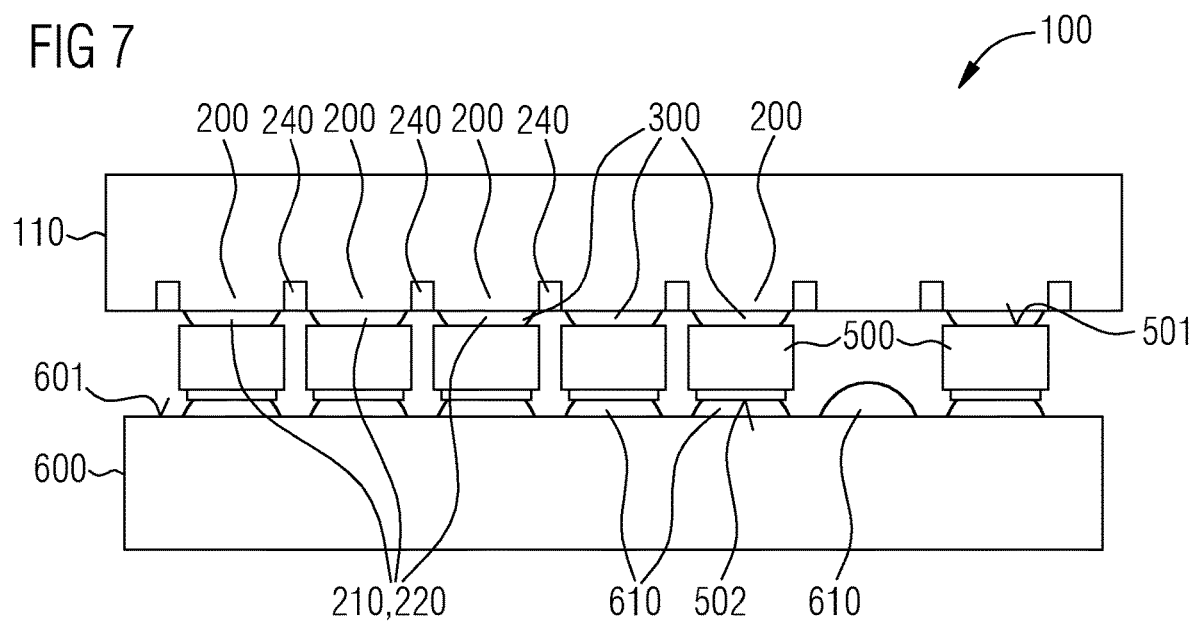
FIG. 7 schematically shows a sectional side view of the segment carrier after the transfer tool has approached the target carrier.

FIG. 7 shows a schematically sectional side view of the segment carrier 110 of the transfer tool 100, the semiconductor chips 500 and the target carrier 600 in a processing status following the representation of FIG. 6.

The segment carrier 110 of the transfer tool 100 has been approached to the target carrier 600 so that the semiconductor chips 500 adhering to segments 200 of the segment carrier 110 via liquid drops 300 have come into contact with the target carrier 600. The bottom sides 502 of the semiconductor chips 500 face the upper side 601 of the target carrier 600. In the example shown in the figures, in which a separate portion of attachment means 610 is provided for each semiconductor chip 500 on the upper side 601 of the target carrier 600, each semiconductor chip 500 adhering to the segment carrier 110 of the transfer tool 100 has been arranged on a separate portion of the attachment means 610.

In a subsequent method step, the segment carrier 110 of the transfer tool 100 is lifted from the target carrier 600. The semiconductor chips 500 that have contacted the target carrier 600 are to be replaced by the segment carrier 110 and remain on the target carrier 600.

If an adhesive force with which the semiconductor chips 500 each adhere to the target carrier 600 is greater than the wetting forces acting between the liquid drops 300 and the semiconductor chips 500 or between the liquid drops 300 and the liquid receiving areas 210 of the segments 200 of the segment carrier 110, the segment carrier 110 of the transfer tool 100 can be lifted off without first removing the liquid drops 300. In this example, the adhesion of the semiconductor chips 500 to the liquid receiving areas 210 of the segments 200 of the segment carrier 110 caused by the liquid drops 300 is severed during the lifting of the segment carrier 110 of the transfer tool 100. It is useful if the adhesive force acting between the semiconductor chips 500 and the target carrier 600 is more than 0.1 N/20 mm². It is particularly useful if this adhesive strength is even between 0.5 N/20 mm² and 5 N/20 mm². A suitably strong adhesion of the semiconductor chips 500 to the upper side 601 of the target carrier 600 can be achieved, for example, by the attachment means 610 previously arranged on the upper side 601 of the target carrier 600.

However, it is also possible to remove the liquid drops 300 from the target carrier 600 before lifting off the segment carrier 110 of the transfer tool 100. In this example, the semiconductor chips that are previously in contact with the target carrier 600 can remain on the target carrier 600 even if there is no strong adhesive force between the semiconductor chips 500 arranged on the target carrier 600 and the target carrier 600, in particular no adhesive force greater than the wetting forces caused by the liquid drops 300. An example may be if no attachment means 610 has been provided on the upper side 601 of the target carrier 600. Thus, the target carrier 600, for example, can be a temporary carrier from which the semiconductor chips 500 are to be replaced at a later point in time.

Removal of the liquid drops 300 before the segment carrier 110 of the transfer tool 100 is lifted off the target carrier 600 can be done, for example, by evaporating the liquid drops 300. For this purpose, heat can be applied to the target carrier 600 before the segment carrier 110 of the transfer tool 100 is lifted off to heat the liquid drops 300 and accelerate evaporation of the liquid drops 300. Heat can be supplied, for example, by heating the segment carrier 110 of the transfer tool 100 or heating the target carrier 600. The liquid drops 300 can also be removed by other means than evaporation.

Figure 8:
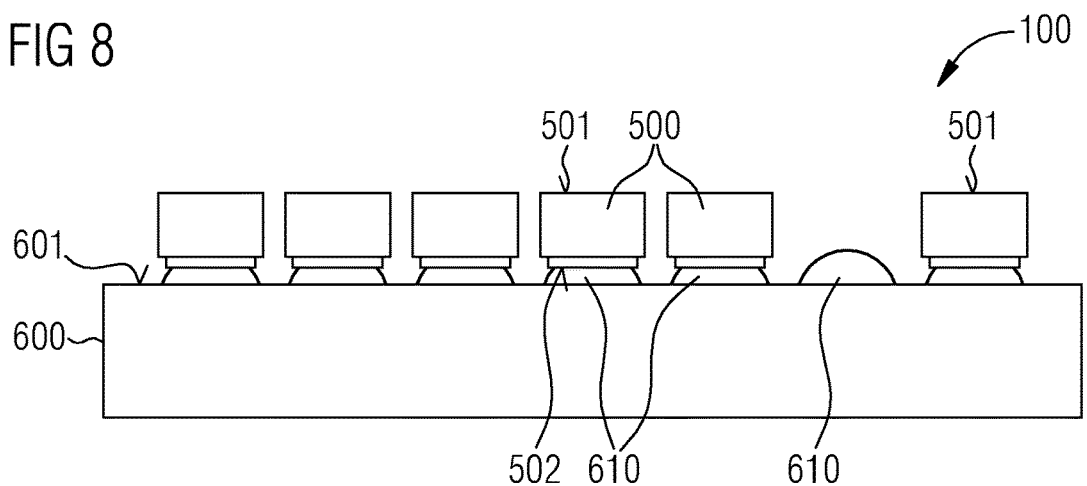
FIG. 8 schematically shows a sectional side view of the target carrier with the semiconductor chips transferred onto it.

FIG. 8 shows a schematically sectional side view of the target carrier 600 and the semiconductor chips 500 remaining at the upper side 601 of the target carrier 600 in a processing status following the representation of FIG. 7.

The segment carrier 110 of the transfer tool 100 has been lifted from the target carrier 600. The semiconductor chips 500 previously attached to the segments 200 of the segment carrier 110 have remained on the upper side 601 of the target carrier 600. After the segment carrier 110 has been lifted off, any remaining residues of the liquid drops 300 on the semiconductor chips 500 have been removed, for example, by evaporation. The transfer of the semiconductor chips 500 from the source carrier 400 to the target carrier 600 is now complete.

FIGS. 9 to 12 below describe different examples of transfer tool 100, each with different options to selectively locate liquid drops 300 at the liquid receiving areas 210 of segments 200 of segment carrier 110. Each of the examples of the transfer tool 100 described below is suitable for transferring semiconductor chips 500 according to the method described in FIGS. 1 to 8.

FIG. 9 shows a schematically sectional side view of the transfer tool 100 according to an example In this example, the transfer tool 100 comprises a print head 120 in addition to the segment carrier 110. The print head 120 has one or more nozzles 125. The print head 120 is provided to shoot drops of liquid 300 onto the liquid receiving areas 210 of the segments 200 of the segment carrier 110 by the nozzles. For each segment 200 of the segment carrier 110, it can be decided individually whether a liquid drop 300 should be shot onto the liquid receiving area 210 of this segment 200. In this way, the liquid drops 300 are arranged at the liquid receiving areas 210 of the segments 200 of the segment carrier 110, analogous to a printing method performed with an inkjet printer.

If the print head 120 has multiple nozzles 125, the print head 120 may be provided to simultaneously shoot 300 drops of liquid onto the liquid receiving areas 210 of multiple segments 200 of the segment carrier 110. If the print head 120 has a number of nozzles 125 less than the number of segments 200 of the segment carrier 110, the segment carrier 110 and the print head 120 of the transfer tool 100 may be movable relative to each other to reposition the print head 120 relative to the segment carrier 110 after each shooting of liquid drops 300 onto one or more of the segments 200 of the segment carrier 110 and to shoot further liquid drops 300 onto the liquid receiving areas 210 of further segments 200 of the segment carrier 110 after each shooting of liquid drops 300 onto one or more of the segments 200 of the segment carrier 110.

In the example of the transfer tool 100 shown in FIG. 9, the liquid receiving areas 210 of the segments 200 of the segment carrier 110 have in addition to the liquid receiving surfaces 220 stamps 230 arranged on the liquid receiving surfaces 220. However, the stamps 230 can also be omitted. Conversely, corresponding stamps 230 may also be provided for those examples of the transfer tool 100 not explicitly shown.

Each stamp 230 projects in a direction perpendicular to the liquid receiving surfaces 220 beyond the liquid receiving surfaces 220 of the liquid receiving areas 210 of the segments 200 of the segment carrier 110. It is useful if the stamps 230 are arranged centrally on the liquid receiving surfaces 220 and cover only a part of the liquid receiving surfaces 220. For example, stamps 230 can be cylindrical, with the longitudinal axes of stamps 230 oriented perpendicular to the liquid receiving surfaces 220 of the liquid receiving areas 210 of the segments 200. In the cutting planes parallel to the liquid receiving surfaces 220, the stamps 230 in this example can have circular disc-shaped or rectangular cross-sectional surfaces. The stamps 230 can also have other shapes.

The stamps 230 can have a metal, polymeric plastic such as an acrylate, silicone, PDMS, glass, ceramic, semiconductor material such as silicon, coated paper or other material. The stamps 230 can be rigid or elastic.

The 230 stamps located on the liquid receiving surfaces 220 of the liquid receiving areas 210 of the segments 200 can be used to center and hold liquid drops 300 located on the liquid receiving areas 210 of the segments 200 on the liquid receiving areas 210.

The 230 stamps can also be used to release the semiconductor chips 500 provided on the upper side 401 of the 400 source carrier from an anchorage during the approach of the segment carrier 110 of the transfer tool 100 to the source carrier 400, for example, to break them. The anchorage may be intended to hold the semiconductor chips 500 at the upper side 401 of the source carrier 400 before transferring the semiconductor chips 500.

FIG. 10 shows a schematically sectional side view of the transfer tool 100 according to another example With the example shown in FIG. 10, each segment 200 of the segment carrier 110 of the transfer tool 100 has a liquid reservoir 250 and a fluid actuator 260. The 260 fluid actuators are each provided to move 255 fluid from the fluid reservoir 250 of each segment 200 to the fluid receiving area 210 of each segment 200 to place a fluid drop 300 on the fluid receiving area 210. The fluid actuators 260 of the individual segments 200 can be controlled independently of each other to be able to selectively arrange liquid drops 300 only at the liquid receiving areas 210 of selected segments 200.

Fluid actuators 260 may additionally be configured to move fluid 255 from the fluid receiving area 210 of each segment 200 to the fluid reservoir 250 of each segment 200 to remove a fluid drop 300 from the fluid receiving area 210. This can be done, for example, after the segment carrier 110 of the transfer tool 100 approaches the target carrier 600 and before the segment carrier 110 of the transfer tool 100 is lifted off the target carrier 600. In this example, the liquid drops 300 are removed from the liquid receiving areas 210 of the segments 200 by the fluid actuators 260. Evaporation of the liquid drops 300 may be unnecessary in this example.

The liquid reservoirs 250 of the segments 200 of the segment carrier 110 of the transfer tool 100 can be separated from each other or connected to each other. In interconnected fluid reservoirs 250, the fluid reservoirs 250 of each segment 200 may connect to a common fluid reservoir 250 in which a larger volume of fluid may be provided.

Figure 11:
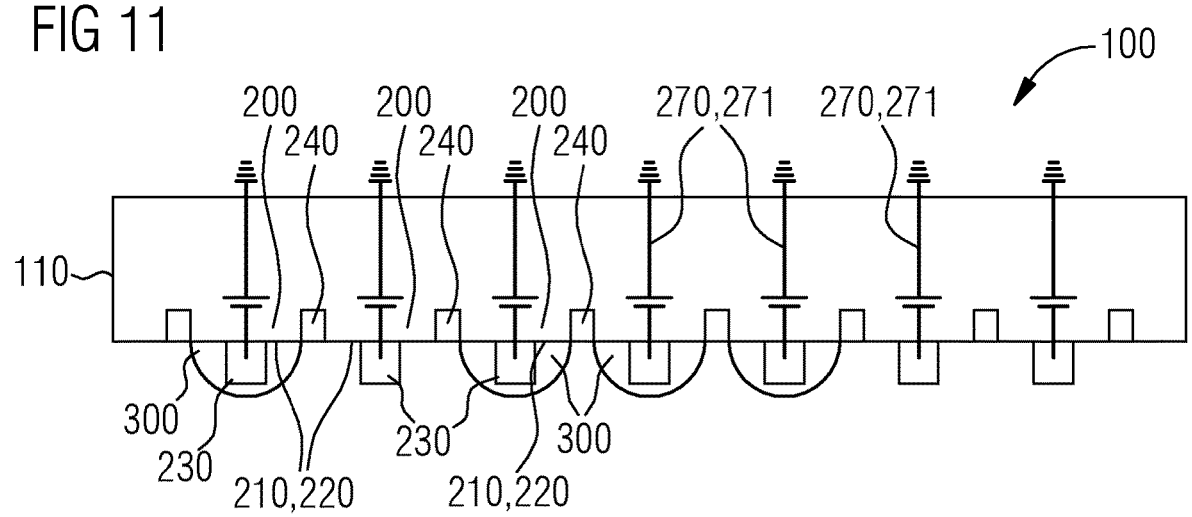
FIG. 11 schematically shows a sectional side view of the transfer tool according to another example.

FIG. 11 shows a schematically sectional side view of a further example of the transfer tool 100. The example of the transfer tool 100 shown in FIG. 11 has a charging device 270 provided to apply electric charge to the liquid receiving areas 210 of the segments 200.

The loading device 270 comprises a plurality of segment loading devices 271. Each segment 200 of the segment carrier 110 has its own segment loading device 271. Each segment loading device 271 is adapted to apply an electrical voltage between the liquid receiving area 210 of each segment 200 and a ground contact to apply an electrical charge to the liquid receiving area 210 of each segment 200. The segment loading devices 271 of the different segments 200 of the segment carrier 110 can be controlled independently of each other to be able to selectively apply electrical charge only to the liquid receiving areas 210 of selected segments 200 of the segment carrier 110 of the transfer tool 100.

With the example of the transfer tool 100 shown in FIG. 11, electrical charge can first be selectively applied to the liquid receiving areas of 210 of selected segments 200 of the segment carrier 110 by the segment loading devices 271. The segment carrier 110 of the transfer tool 100 can then be immersed in a polar liquid such as water such that the liquid receiving areas 210 of the segments 200 of the segment carrier 110 come into contact with the polar liquid. After the segment carrier 110 is immersed in the polar liquid, liquid drops 300 adhere to the liquid receiving areas 210 of those segments 200 to which liquid receiving areas 210 have previously been electrically charged. At each liquid receiving area 210 to which no electrical charge has previously been applied, no liquid drops 300 of the polar liquid remain attached.

Figure 12:
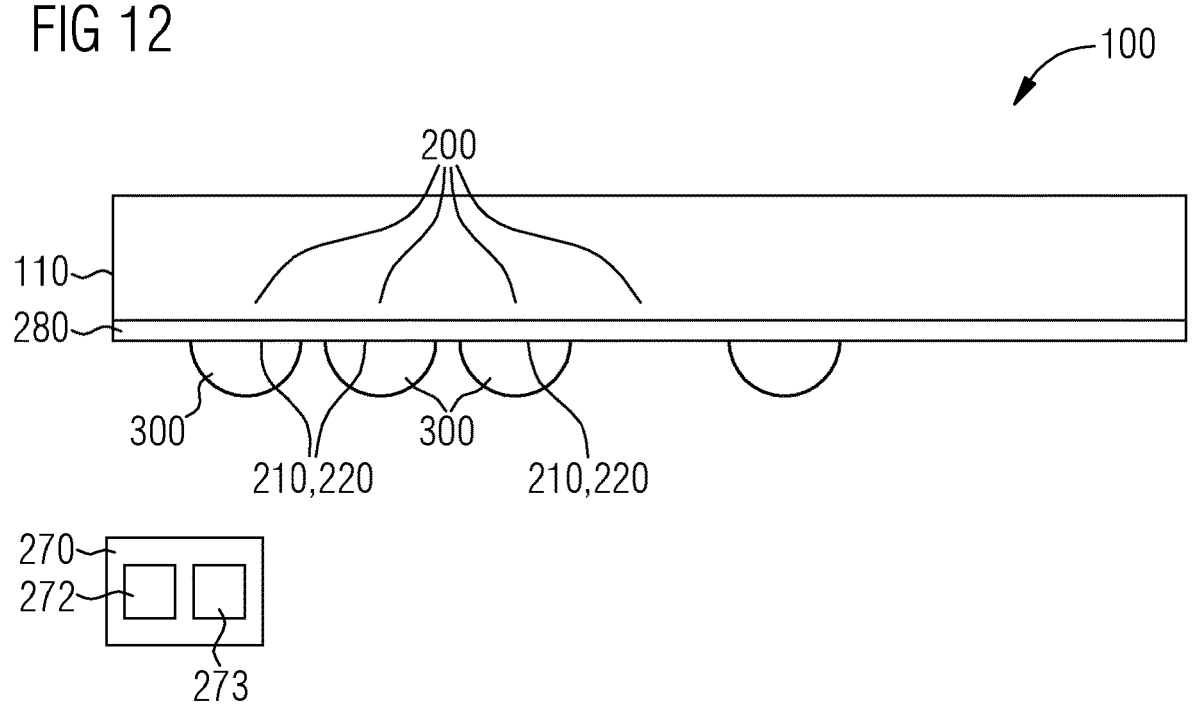
FIG. 12 schematically shows a sectional side view of the transfer tool according to another example.

FIG. 12 shows a schematically sectional side view of a further example of the transfer tool 100. Also, in the example of the transfer tool 100 shown in FIG. 12, it comprises a loading device 270 adapted to apply electric charge to the liquid receiving areas 210 of the segments 200 of the segment carrier 110.

In the transfer tool 100 example shown in FIG. 12, the loading device 270 comprises a charging unit 272 adapted to charge the liquid receiving areas 210 of all segments 200 of the segment carrier 110 of the transfer tool 100. The segment carrier 110 has an electrostatically chargeable film 280 covering the liquid receiving areas 210 of the segments 200 of the segment carrier 110 or forms the liquid receiving areas 210 of the segments 200 of the segment carrier 110. The electrostatically chargeable film 280, for example, can be a film coated with a photoconductive material. The charging unit 272 of the charging device 270 of the transfer tool 100 is provided to electrostatically charge the electrostatically chargeable foil 280 in the area of all segments 200 of the segment carrier 110, for example, to charge it negatively. The charging unit 272 can be equipped with a charging corona or a charging roller, for example.

The loading device 270 of the transfer tool 100 of the example shown in FIG. 12 also includes a discharging unit 273. The discharging unit 273 is provided to selectively discharge the liquid receiving areas 210 individual segments 200 of the segment carrier 110 after they have previously been electrostatically charged by the 272 charger. The discharging unit 273 is thus provided to selectively discharge the electrostatically chargeable film 280 in sections. For example, if the electrostatically chargeable film 280 comprises a photoconductive material, the discharging unit 273 may comprise a laser device adapted to generate a laser beam that can be selectively directed at the liquid receiving areas 210 of desired segments 200 of the segment carrier 110. The loading device 270 of the example of the transfer tool 100 shown in FIG. 12 is similar to a laser printer in this example.

The loading device 270 of the example of the transfer tool 100 shown in FIG. 12 makes it possible to first electrostatically charge the liquid receiving areas 210 of all segments 200 of the segment carrier 110 and then discharge the liquid receiving areas 210 of selectively selected segments 200 of the segment carrier 110 again. Thus, the loading device 270 allows electrical charge to be selectively applied to the liquid receiving areas 210 of selected segments 200 of the segment carrier 110.

After this selective application of electrical charge to the liquid receiving areas 210 of at least some of the segments 200, the segment carrier 110 may be immersed in a polar liquid to locate drops of liquid 300 at the liquid receiving areas 210 of those segments 200 of the segment carrier 110 to which electrical charge has previously been applied. This is done exactly as for the example of the transfer tool 100 described in FIG. 11.

The liquid drops 300 applied to the liquid receiving areas 210 of the segments 200 of the segment carrier 110 of the transfer tool 100 by the methods described in FIGS. 9 to 12 may contain, for example, water, a solvent, a hydrocarbon, a silicone, a siloxane, a resin or a wax. If the liquid drops 300 contain hydrocarbons, it is appropriate to use long-chain, poorly volatile hydrocarbons such as an oil, an epoxide or an acrylate. The liquid drops 300 can also contain mixtures of the mentioned or other materials.

It is also possible to use a mixture of isopropanol and organic solid particles such as resins. In this example, the volatile substance such as isopropanol can evaporate from the 210 liquid drops 300 applied to the liquid receiving areas after the 300 liquid drops have been applied, leaving only the sticky solid.

In the liquid drop 300 application method described in FIG. 9, it is also possible to use a wax as the liquid, which is liquefied in the nozzles 125 of the printhead 120 to apply the resin as a liquid drop 300. After the liquid drops 300 have been applied, the transfer tool 100 has approached the source carrier 400 and the semiconductor chips 500 have been wetted by the liquid drops 300, the liquid drops 300 can solidify in this example to additionally increase the adhesive forces acting between the liquid drops 300 and the semiconductor chips 500. In this example, after the transfer tool 100 approaches the target carrier 600, the liquid drops 300 can be liquefied again by heating to allow the semiconductor chips 500 that have come into contact with the target carrier 600 to remain at the target carrier 600.

It is also possible to use a solvent for the liquid drops that evaporates after removing the semiconductor chips 500 wetted by the liquid drops 300 from the source carrier 400 with the transfer tool 100. In this example it is advisable to form the liquid receiving areas 210 of the segments 200 with stamps 230. After the liquid drops 300 have evaporated, the semiconductor chips 500 arranged on the segments 200 of the segment carrier 110 of the transfer tool 100 can adhere to the liquid receiving areas 210 of the segments 200 by van der Waals forces acting between the surfaces of the stamps 230 and the upper side 501 of the semiconductor chips 500.

It is also possible that to selectively place the liquid drops 300 at the liquid receiving areas 210 of at least some of the segments 200 of the segment carrier 110 of the transfer tool 100, a solid such as a wax, is first applied to the liquid receiving areas 210 of all the segments 200 of the segment carrier 110 of the transfer tool 100 to selectively place the liquid drops 300 at the liquid receiving areas 210 of at least some of the segments 200 of the segment carrier 110 of the transfer tool 100. The solid is then selectively liquefied in at least some of the segments 200 to form a drop of liquid 300. Selective liquefaction of the solid can be achieved by selectively heating the liquid receiving areas 210 of the respective segments 200 of the segment carrier 110 by a heating device of the segment carrier 110.

Figure 13:
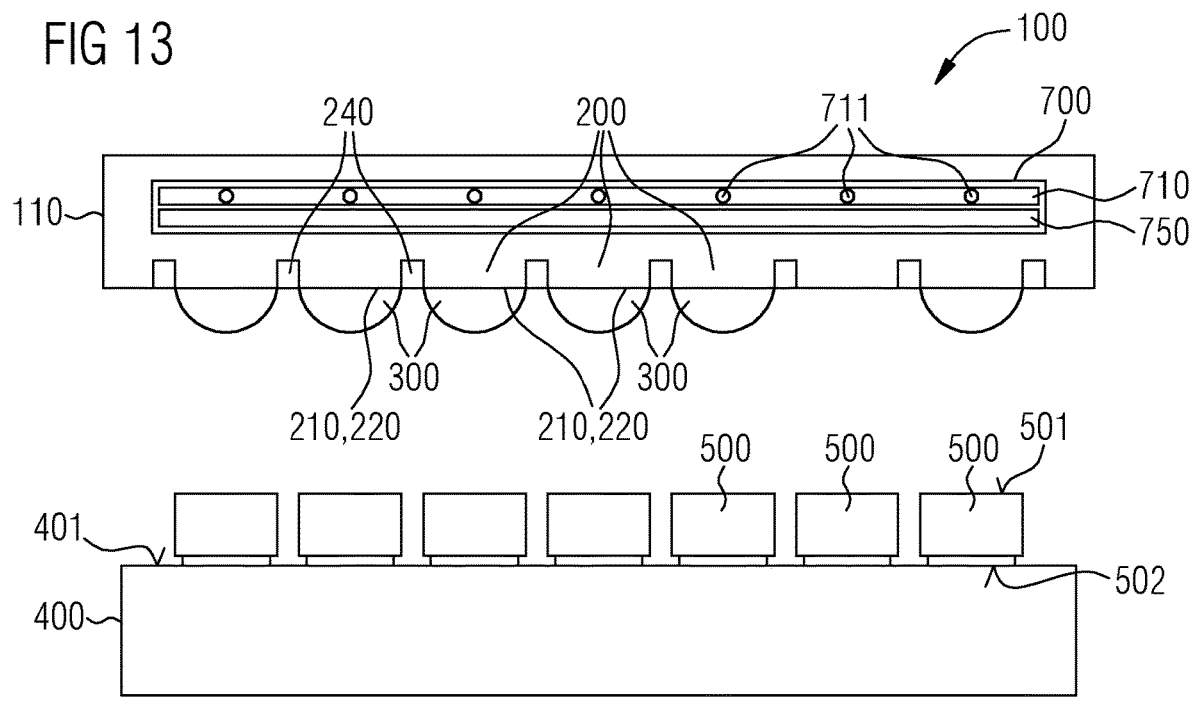
FIG. 13 schematically shows a sectional side view of the transfer tool according to a further example as well as of the source carrier with the semiconductor chips arranged thereon.

FIG. 13 shows a schematically sectional side view of the segment carrier 110 of the transfer tool 100 according to another example. FIG. 13 also shows a schematically sectional side view of the source carrier 400 and the semiconductor chips 500 provided on the upper side 401 of the source carrier 400.

The example of the segment carrier 110 of the transfer tool 100 shown in FIG. 13 enables a further method to be carried out to selectively arrange the liquid drops 300 at the liquid receiving areas 210 of at least some of the segments 200 of the segment carrier 110. Therefore, the transfer tool 100 described in the example of FIG. 13 has a temperature control device 700 provided to bring the liquid receiving areas 210 of different segments 200 of the segment carrier 110 to different temperatures.

The temperature control device 700 of the transfer tool 100 enables the selective cooling of the liquid receiving areas 210 of at least some of the segments 200 of the segment carrier 110 below a dew point for the selective arrangement of liquid drops 300 at the liquid receiving areas 210 of the selected segments 200. The liquid receiving areas 210 of the remaining segments 200 of the segment carrier 110 are left at a temperature above the dew point. For example, the temperature below the dew point may be 5° C. The temperature above the dew point can be 25° C., for example The dew point may be 15° C., for example. During selective cooling of the liquid receiving areas 210 of the selected segments 200 below the dew point, liquid from the vicinity of the transfer tool 100 condenses at the liquid receiving areas 210 of the cooled segments 200, thereby forming liquid drops 300 at the liquid receiving areas 210 of the selected segments 200.

The temperature control device 700 of the transfer tool 100 can comprise a cooling device 750 provided to cool the liquid receiving areas 210 of the segments 200 of the segment carrier 110. In addition, the temperature control device 700 may include a heating device 710 provided to heat the liquid receiving areas 210 of the segments 200 of the segment carrier 110. For example, each segment 200 of the segment carrier 110 can be assigned its own heating element 711 of the heating device 710 to be able to selectively heat the liquid receiving area 210 of the respective segment 200. In this example, the heating elements 711 of the different segments 200 of the segment carrier 110 can be controlled independently of each other. Various examples of the temperature control device 700 are explained below in conjunction with FIGS. 18 to 21.

To bring the liquid receiving areas of 210 different segments 200 of the segment carrier 110 of the transfer tool 100 to different temperatures by the temperature control device 700, the liquid receiving areas of 210 of all segments 200 of the segment carrier 110 can be cooled to a low temperature with the cooling device 750. Subsequently or simultaneously, the liquid receiving areas of 210 individual selected segments 200 of the segment carrier 110 can be selectively heated by their heating elements 711. As a result, unheated segments 200 remain at the low temperature achieved by the cooling device 750, while the liquid receiving areas 210 of the segments 200 heated by their heating elements 711 assume a higher temperature.

In the following, FIGS. 14 to 17 are used to describe a further example of the method of transferring semiconductor chips 500 described above using FIGS. 1 to 8. The method of transferring semiconductor chips described in FIGS. 14 to 17 is very similar to the method described in FIGS. 1 to 8. The above description of the method of transferring semiconductor chips therefore also applies to the method described in FIGS. 14 to 17, unless deviations are described below. The method described below can be carried out with the method shown in FIG. 13 of the transfer tool 100 and combined with the method described in FIG. 13 for the selective arrangement of liquid drops at the liquid receiving areas 210 of the segments 200 of the segment carrier 110. However, in the method described below, the liquid drops 300 can also be applied by any of the methods described in FIGS. 9 to 12 or any other method.

In each example, the transfer tool 100 in the example of the method of transferring semiconductor chips 500 described below using FIGS. 14 to 17 has a temperature control device 700 to bring the liquid receiving areas 210 of different segments 200 to different temperatures. The transfer tool 100 can be in the configuration as described in FIG. 13.

Figure 14:
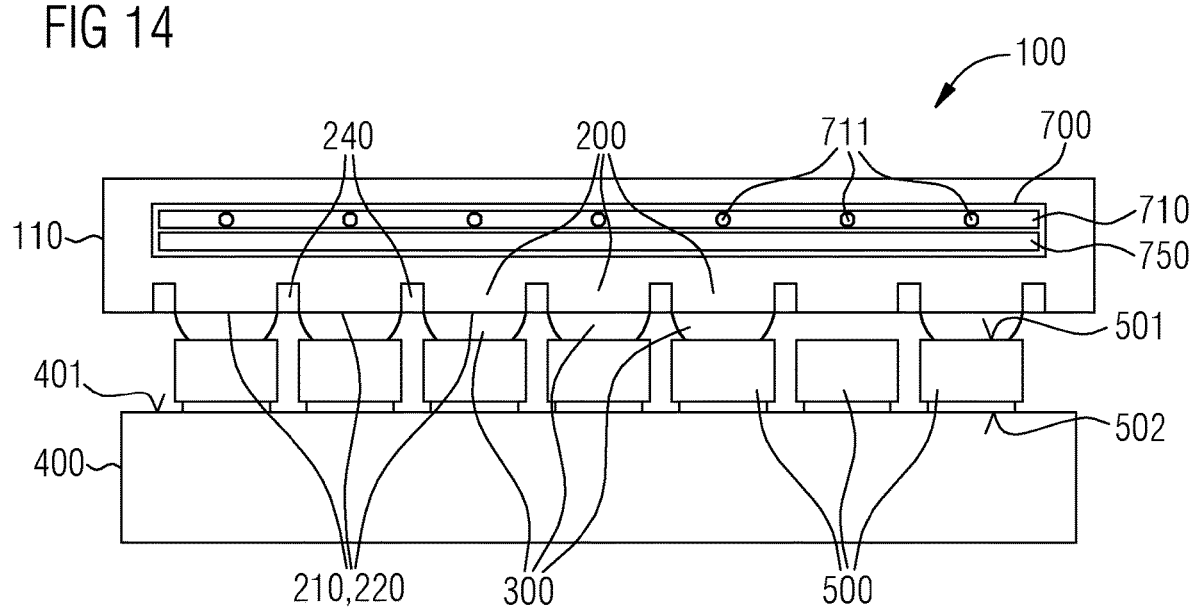
FIG. 14 schematically shows a sectional side view of the transfer tool after approaching the source carrier.

FIG. 14 shows a schematically sectional side view of the segment carrier 110 of the transfer tool 100 and the source carrier 400 with the semiconductor chips 500 provided at the upper side 401 of the source carrier 400 in a processing status corresponding to the representation of FIG. 4 during the process of the method of transferring the semiconductor chips 500 from the source carrier 400 to the target carrier 600. In the representation of FIG. 14 preceding method steps, drops of liquid 300 have been selectively arranged at the liquid receiving areas 210 of at least some of the segments 200 of the segment carrier 110 of the transfer tool 100. Subsequently, the segment carrier 110 of the transfer tool 100 was approached to the source carrier 400 such that each liquid drop 300 came into contact with a semiconductor chip 500 arranged on the upper side 401 of the source carrier 400 and wetted it.

After wetting the semiconductor chips 500 by the liquid drops 300, the liquid receiving areas 210 of at least the segments 200 of the segment carrier 110 on which liquid drops 300 are arranged are cooled below a freezing point of the liquid drops 300. If the liquid drops contain 300 water, the liquid absorption areas 210 of the segments 200 can be cooled below 0° C., for example By cooling the liquid receiving areas 210 of at least the segments 200 on which liquid drops 300 are arranged, the liquid drops 300 arranged on the liquid receiving areas 210 of these segments 200 freeze at least partially. As a result, the adhesive forces acting between the liquid drops 300 and the semiconductor chips 500 wetted by the liquid drops 300 increase, and the semiconductor chips 500 are held particularly reliably by the liquid drops 300 at the liquid receiving areas 210 of the segments 200.

Figure 15:
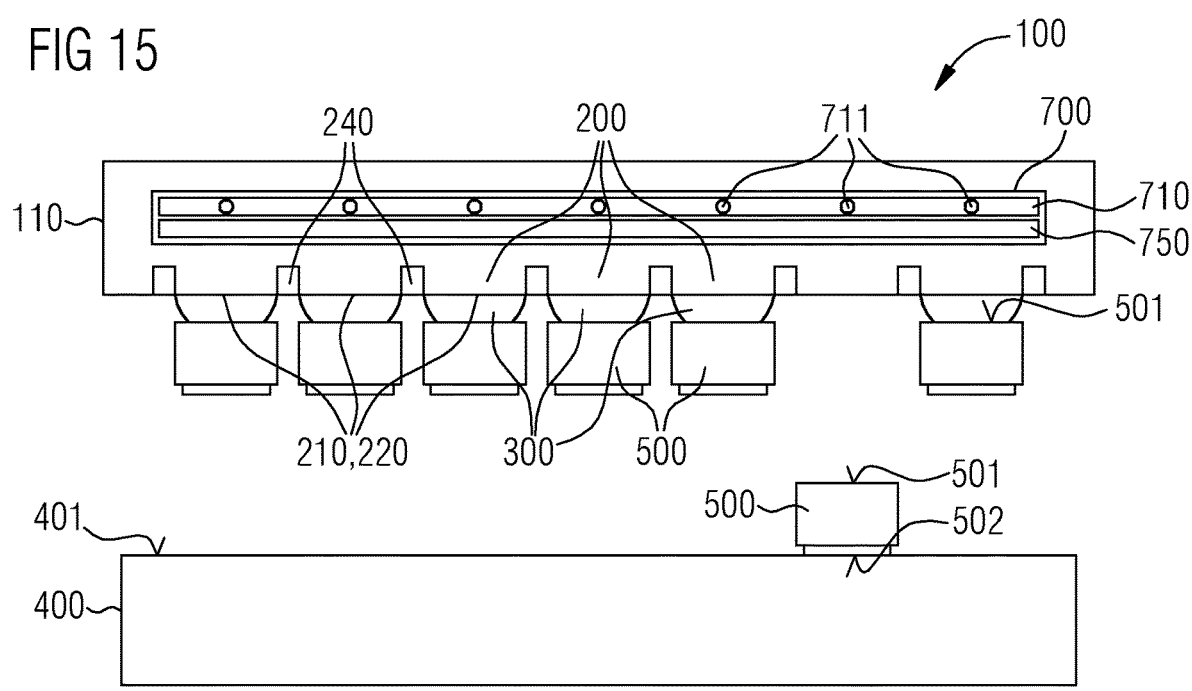
FIG. 15 schematically shows a sectional side view of the transfer tool after lifting from the source carrier.

FIG. 15 shows a schematically sectional side view of the segment carrier 110 of the transfer tool 100, the source carrier 400 and the semiconductor chips 500 in a processing status following the representation of FIG. 14. The processing status shown in FIG. 15 corresponds to the processing status shown in FIG. 5.

The transfer tool 100 has been lifted from the source carrier 400. The semiconductor chips 500 wetted by at least partially frozen liquid drops 300 with the segment carrier 110 of the transfer tool 100 were lifted from the source carrier 400.

Figure 16:
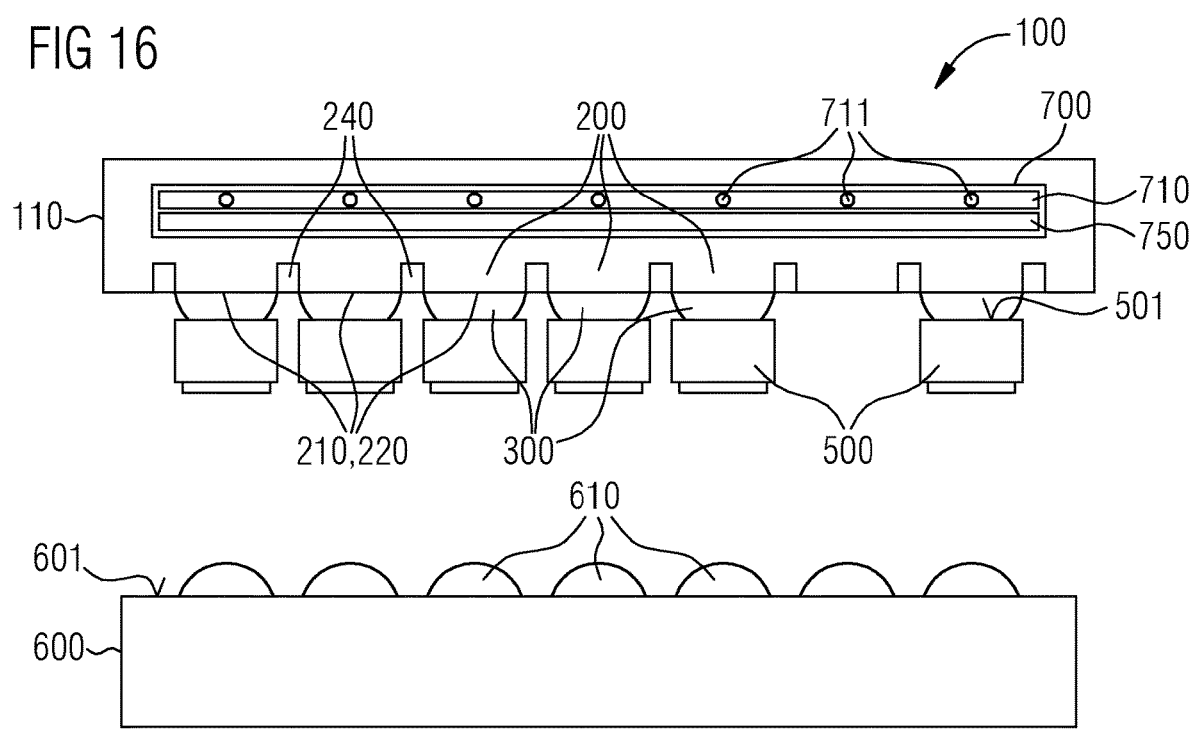
FIG. 16 schematically shows a sectional side view of the transfer tool and the target carrier.

FIG. 16 shows a schematically sectional side view of the segment carrier 110 of the transfer tool 100, the semiconductor chips 500 adhering to the liquid receiving areas 210 of the segments 200 of the segment carrier 110 and the target carrier 600 in a processing status following in time the representation of FIG. 15. The processing status shown in FIG. 16 corresponds to the processing status shown in FIG. 6.

The segment carrier 110 of the transfer tool 100 has been aligned with the target carrier 600 and the portions of attachment means 610 arranged on the upper side 601 of the target carrier 600.

Figure 17:
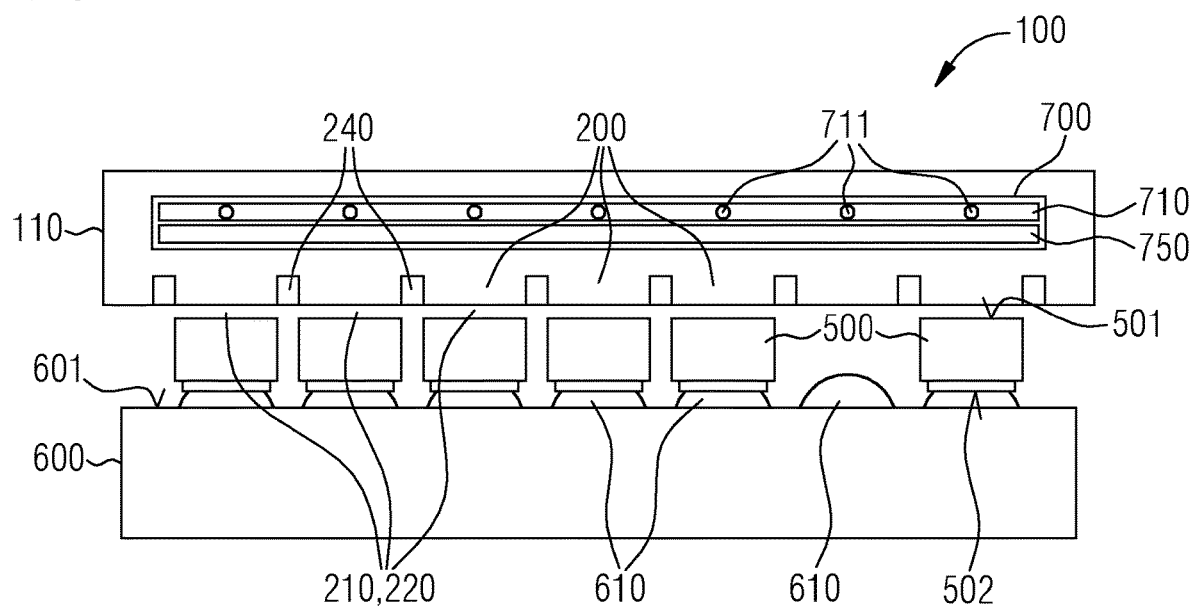
FIG. 17 schematically shows a sectional side view of the transfer tool after the approaches to the target carrier.

FIG. 17 shows a schematically sectional side view of the segment carrier 110 of the transfer tool 100, the target carrier 600 and the semiconductor chips 500 in a processing status following the representation of FIG. 16. The processing status shown in FIG. 17 corresponds to a processing status between the illustrations in FIGS. 7 and 8.

The segment carrier 110 of the transfer tool 100 has been approximated to the target carrier 600. The semiconductor chips 500 arranged on the segment carrier 110 of the transfer tool 100 came into contact with the target carrier 600.

Subsequently, the liquid receiving areas 210 of at least the segments 200 of the segment carrier 110 of the transfer tool 100, on which liquid drops 300 were arranged, were heated above the freezing point of the liquid drops 300. As a result, the previously at least partially frozen liquid drops 300 are at least partially thawed. This has reduced the adhesive force between the liquid drops 300 and the semiconductor chips 500 wetted by the liquid drops 300.

At this time, the segment carrier 110 of the transfer tool 100 can be lifted from the target carrier 600.

If the adhesive force with which the semiconductor chips 500 adhere to the target carrier 600 is greater than the adhesive force remaining between the liquid drops 300 and the semiconductor chips 500 after at least partial thawing of the liquid drops 300, and between the liquid drops 300 and the liquid receiving areas 210 of the segments 200, the semiconductor chips 500 in contact with the target carrier 600 may remain on the target carrier 600. To avoid this, a further method step can be provided to remove the drops of liquid 300 to achieve the processing status shown in FIG. 17. For example, the liquid drops 300 may have been removed by heating the liquid receiving areas 210 of the segments 200 of the segment carrier 110 of the transfer tool 100, whereby the liquid drops 300 have evaporated.

Starting from the processing status shown in FIG. 17, the segment carrier 110 of the transfer tool 100 can now be lifted from the target carrier 600. Since there is no longer any contact between the liquid receiving areas 210 of the segments 200 of the segment carrier 110 and the semiconductor chips 500 that have contacted the target carrier 600, the semiconductor chips 500 remain on the target carrier 600. This concludes the method of transferring the semiconductor chips 500.

Figure 18:
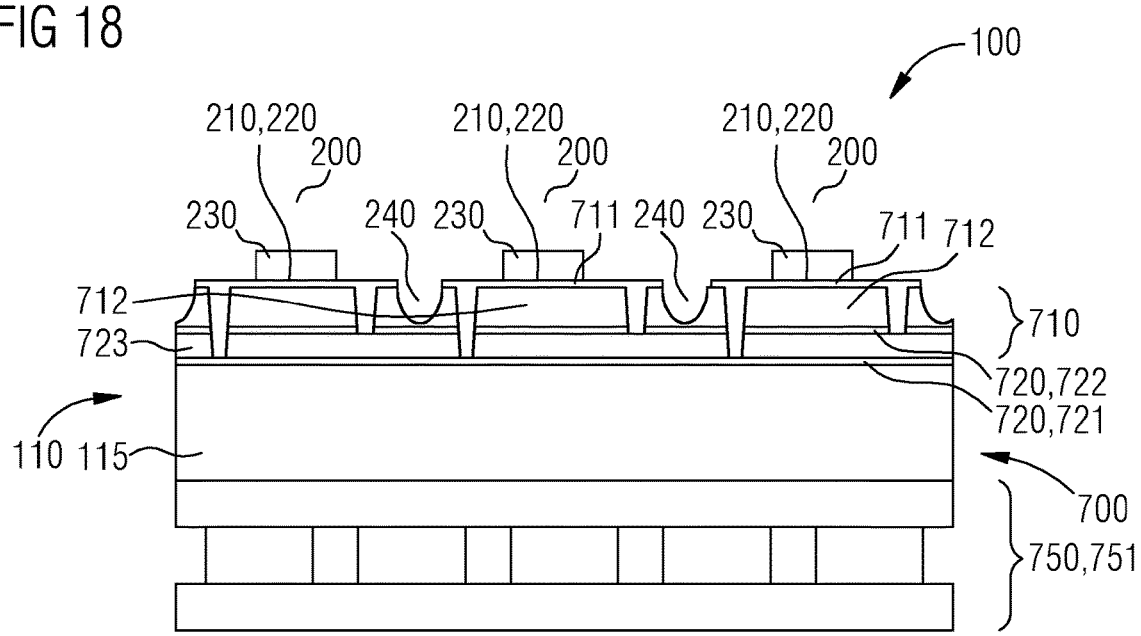
FIG. 18 schematically shows a sectional side view of the transfer tool according to another example.
Figure 19:
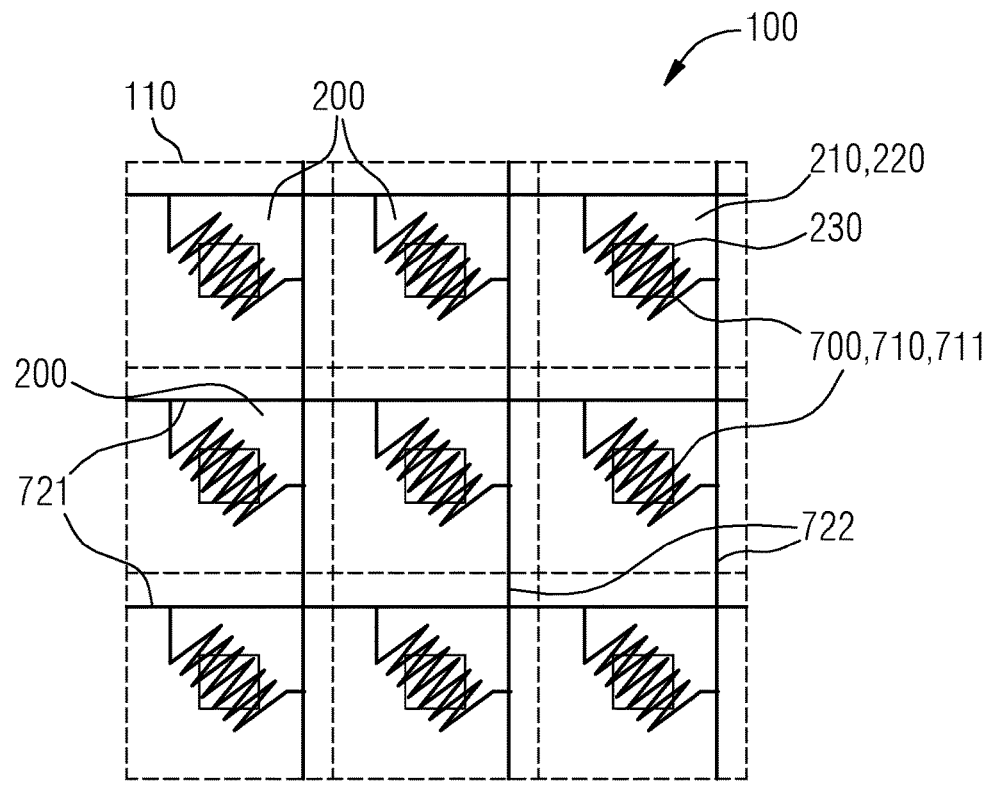
FIG. 19 schematically shows a part of a cross matrix circuit of the transfer tool.

FIG. 18 shows a schematically sectional side view of a part of the transfer tool 100 according to another example. FIG. 19 shows a schematic top view of the liquid receiving areas 210 of some segments 200 of the segment carrier 110 of the transfer tool 100 of the example shown in FIG. 18.

In the example shown in FIGS. 18 and 19, the transfer tool 100 has a temperature control device 700 intended to bring the liquid receiving areas of 210 different segments 200 of the segment carrier 110 to different temperatures. This makes the example of the transfer tool 100 shown in FIGS. 18 and 19 particularly suitable for carrying out the methods described above using FIGS. 13 to 17.

The temperature control device 700 of the transfer tool 100 comprises a heating device 710 with a plurality of heating elements 711. Each segment 200 of the segment carrier 110 is assigned its own heating element 711, which is intended to heat the liquid receiving area 210 of the respective segment 200. For example, the 711 heating elements can each be provided as a heating resistor, for example, as a meander-shaped platinum conductor track.

The heating elements 711 of the heating device 710 of the transfer tool 100 can also be used to measure the temperatures of the liquid receiving areas 210 of the segments 200 of the segment carrier 110. If the heating elements 711 are in the form of meander-shaped resistance structures made of platinum, the temperature of the respective liquid receiving area 210 can be measured by measuring the electrical resistance of the respective heating element 711.

The heating elements 711 of the different segments 200 of the segment carrier 110 are all independently controllable. The heating elements 711 of the heating device 710 can be controlled via a cross matrix circuit 720. Each heater 711 connects to a row line 721 and a column line 722 of the cross matrix circuit 720, respectively, which allow electrical current to pass through each heater 711 to selectively heat the liquid receiving area 210 of each segment 200.

In the example of the transfer tool 100 shown schematically in FIGS. 18 and 19, the heating elements 711 are each arranged directly on the liquid receiving surfaces 220 of the liquid receiving areas 210 of the segments 200 of the segment carrier 110. The 711 heating elements are thermally insulated from each other by a thermal insulator 712 and electrically insulated from the column lines 722. The column lines 722 and the row lines 721 of the cross matrix circuit 720 are electrically isolated from each other by a dielectric 723. Electrically conductive connections between the heating elements 711 and the row lines 721 and between the heating elements 711 and the column lines 722 are made by through-contacts extending through the thermal insulator 712 and the dielectric 723. These through-contacts can, like the row lines 721 and the column lines 722, contain copper, for example. The thermal insulator 712 can, for example, be formed by a photoresist. Dielectric 723, for example, can also be formed by a photoresist or by benzocyclobutene (BCB).

The segment carrier 110 of the transfer tool 100 has a substrate 115. The substrate is provided as a flat layer and can have a thickness of 1 mm or less, for example. It is advisable that the substrate 115 is heat conductive and electrically insulating. The substrate 115, for example, can have high-resistance silicon or ceramic AlN.

The liquid receiving areas 210 of the segments 200 of the segment carrier 110 are formed on one side of the substrate 115. On this side of substrate 115 are also formed the structures and layers forming the heating devices 710.

On an opposite side of the substrate 115 of the segment carrier 110, a cooling device 750 is arranged to cool the liquid receiving areas 210 of the segments 200 of the segment carrier 110. In the example shown in FIGS. 18 and 19, the cooling device 750 includes a Peltier element 751. In addition, the cooling element 750 may have a heat sink or heat exchanger.

During operation of the transfer tool 100, the cooling device 750 of the temperature control device 700 of the transfer tool 100 can cool the liquid receiving areas 210 of the segments 200 to a low temperature of −10° C., for example. For selected individual segments 200 of segment carrier 110, the heating device 710 is used to increase the temperature of the respective liquid receiving area 210 compared to the low temperature. Thus, the transfer tool 100 of the example shown in FIGS. 18 and 19 enables the liquid receiving areas 210 of the individual segments 200 of the segment carrier 110 to be set independently of each other.

Figure 20:
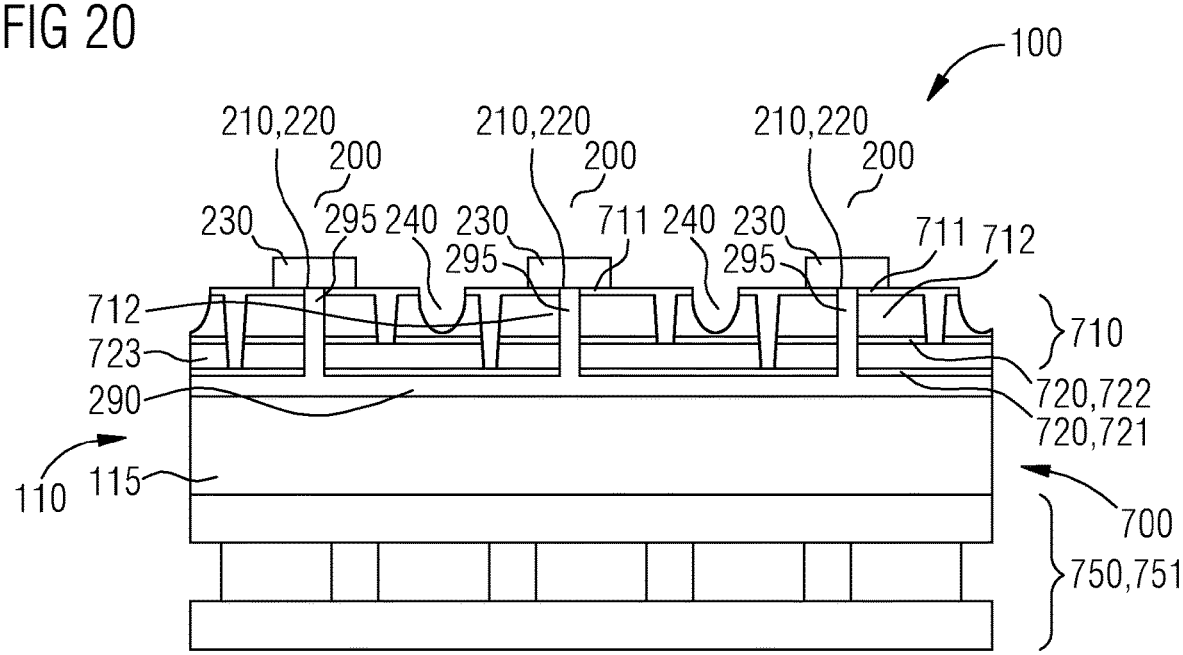
FIG. 20 schematically shows a sectional side view of the transfer tool according to another example.

FIG. 20 shows a schematically sectional side view of a part of the segment carrier 110 of the transfer tool 100 according to another example. The example of the transfer tool 100 shown in FIG. 20 is very similar to the example of the transfer tool 100 shown in FIG. 18. Only the differences between the example shown in FIG. 20 and the example of the transfer tool 100 shown in FIG. 18 are described below.

In the example of the transfer tool 100 shown in FIG. 20, the stamps 230 arranged on the liquid receiving surfaces 220 of the liquid receiving areas 210 of the segments 200 of the segment carrier 110 of the transfer tool 100 each have a microporous material. From each microporous stamp 230 of the segment carrier 110 there is a liquid-conducting connection 295 to a liquid reservoir 290.

If the liquid receiving areas of 210 selected segments 200 of the segment carrier 110 of the example form of the transfer tool 100 shown in FIG. 20 are cooled below the dew point, then in the segments 200 of the segment carrier 110 liquid can pass from the liquid reservoir 290 via the liquid-conducting connections 295 to the microporous stamps 230 in order to form liquid drops 300 at the liquid receiving areas 210 of the respective segments 200.

Figure 21:
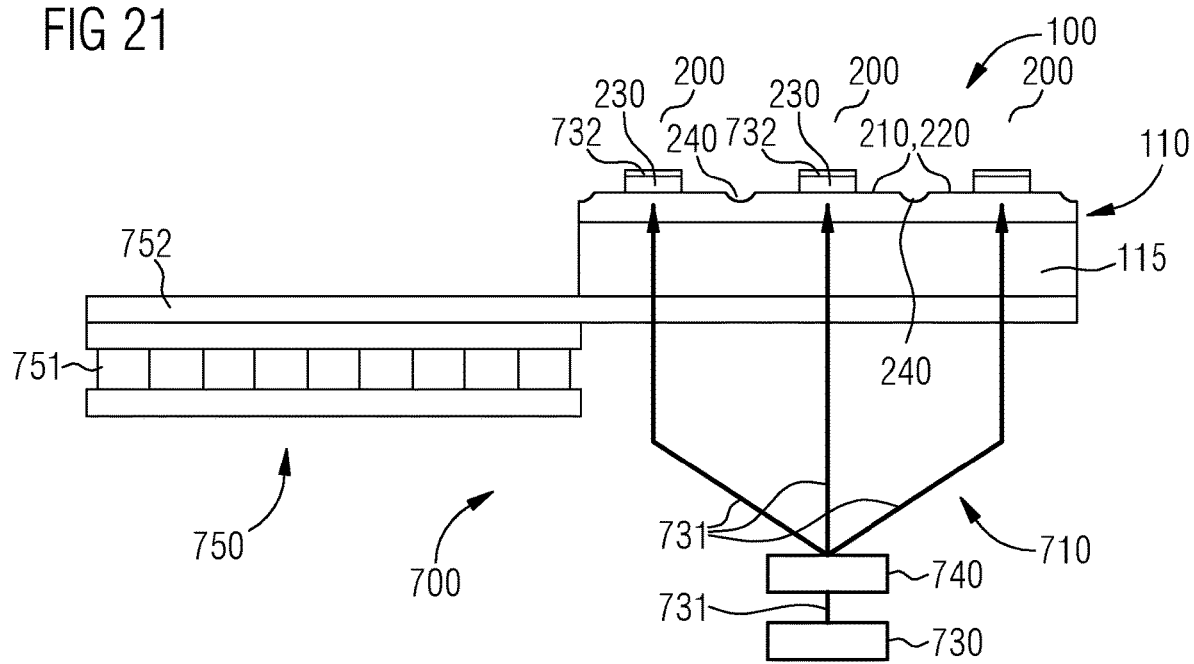
FIG. 21 schematically shows a sectional side view of the transfer tool according to another example.

FIG. 21 shows a schematically sectional side view of the segment carrier 110 of the transfer tool 100 according to another example. The example of the transfer tool 100 shown in FIG. 21 is similar to the example of the transfer tool 100 shown in FIG. 18. The following only describes the aspects in which the example of the transfer tool 100 shown in FIG. 21 differs from the example of the transfer tool 100 shown in FIG. 18.

In the transfer tool 100 example shown in FIG. 21, the heating device 710 that heats the liquid receiving areas 210 comprises a laser light source 730 and a deflection device 740 instead of the heating elements 711. The laser light source 730 is provided to generate a laser beam 731. The deflection device 740 is provided to selectively deflect the laser beam 731 generated by the laser light source 730 to the liquid receiving areas 210 of the individual segments 200 of the segment carrier 110. For this purpose, the deflection device 740 may, for example, have one or more movable mirrors.

The liquid receiving areas 210 of the segments 200 of the segment carrier 110 of the transfer tool 100 example shown in FIG. 21 each have an absorbent layer 732 provided to absorb light from the laser beam 731 emitted by the laser light source 730 under heat generation. In the example shown in FIG. 21, the absorbent layers 732 are arranged on the stamps 230 of the segments 200. The absorbing layers 732 can also be arranged at other positions of the liquid receiving areas 210 of the segments 200.

The heating device 710 of the transfer tool 100 of the example shown in FIG. 21 allows the laser beam 731 generated by the laser light source 730 to be selectively directed by the deflector device 740 towards the absorbent layers 732 of the liquid receiving areas 210 of the selected segments 200 of the segment carrier 110 to selectively heat the liquid receiving areas 210 of the segments 200 of the segment carrier 110.

The cooling device 750 of the transfer tool 100 of the example shown in FIG. 21 is provided such that it does not hinder the deflection of the laser beam 731 generated by the laser light source 730 onto the liquid receiving areas 210 of the segments 200 of the segment carrier 110. For this purpose, the cooling device 750 has a heat pipe 752 through which heat can be transported from the liquid receiving areas 210 of the segments 200 of the segment carrier 110 to the spaced Peltier element 751. Instead of the Peltier element 751, a heat sink could also be provided, which radiates the heat carried away by the heat pipe 752 from the liquid receiving areas 210 of the segments 200 into the environment.

The method of transferring semiconductor chips 500 described above comprises the providing of a plurality of semiconductor chips 500 in a regular array on the source carrier 400. Below is an example of a method of providing the semiconductor chips 500 on the source carrier 400 using FIGS. 22 to 26. However, the semiconductor chips 500 can also be provided on the source carrier 400 by another method.

Figure 22:
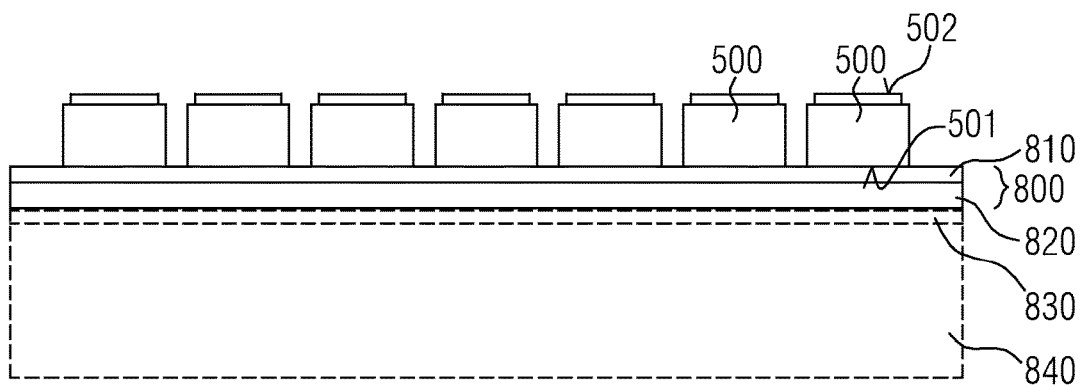
FIG. 22 schematically shows a film with semiconductor chips arranged on it.

FIG. 22 shows a schematically sectional side view of a film 800. The film 800 comprises a carrier film 820 and an adhesive film 810 arranged on the carrier film 820. The carrier film 820 can have PET or PVC, for example. The adhesive film 810 can contain an acrylate or a silicone, for example.

The semiconductor chips 500 are provided in a regular arrangement on the 810 adhesive film of the film 800. The regular arrangement can be a row or matrix arrangement. The semiconductor chips 500 are arranged on the adhesive film 810 of the film 800 such that the upper sides of the semiconductor chips 500 face the film 800 and are in contact with the adhesive film 810 of the film 800.

The film 800 can initially be arranged on a hard carrier 840, as shown in FIG. 22 as an example. The hard carrier 840 can be rigid to prevent slippage of the semiconductor chips 500 provided on the foil 800. The film 800 can be attached to the hard carrier 840 via a further adhesive film 830. The other 830 adhesive film can be, for example, a thermally soluble 810 adhesive film. However, the use of the hard carrier 840 can also be dispensed with.

Figure 23:
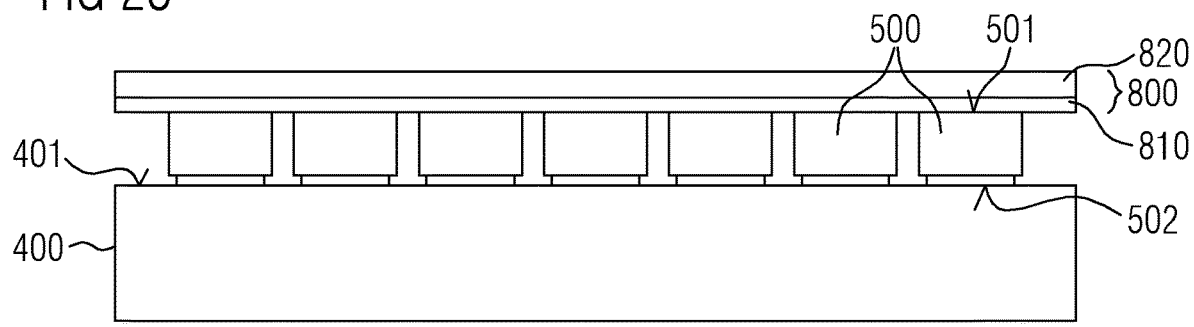
FIG. 23 schematically shows a sectional side view of the foil placed on the source carrier with the semiconductor chips arranged on it.

FIG. 23 shows a schematically sectional side view of the film 800 with the semiconductor chips 500 provided on it in one of the following processing status shown in FIG. 22. FIG. 23 also shows a schematically sectional side view of the provided source carrier 400 with the upper side 401.

If the film 800 was previously attached to the hard carrier 840, then the film 800 with the semiconductor chips 500 arranged on it was first detached from the hard carrier 840. This can be done by thermal loosening of the further adhesive film 830, for example.

After removing the hard carrier 840, the foil 800 with the semiconductor chips 500 arranged on it was placed on the upper side 401 of the source carrier 400 such that the semiconductor chips 500 face the upper side 401 of the source carrier 400. The bottom sides 502 of the semiconductor chips 500 face the upper side 401 of the source carrier 400. The semiconductor chips 500 are now arranged between the upper side 401 of the source carrier 400 and the foil 800.

It is possible to apply a vacuum in the processing status shown in FIG. 23 to ensure that the semiconductor chips 500 rest evenly and flatly on the source carrier 400. The vacuum can also be applied to the source carrier 400 during application of the film 800. The vacuum can be applied by a frit, for example.

The source carrier 400 is at a temperature above a dew point of the environment during the application of the film 800 and in the processing status shown in FIG. 23. For example, the source carrier 400 may have a temperature of 20° C.

Figure 24:
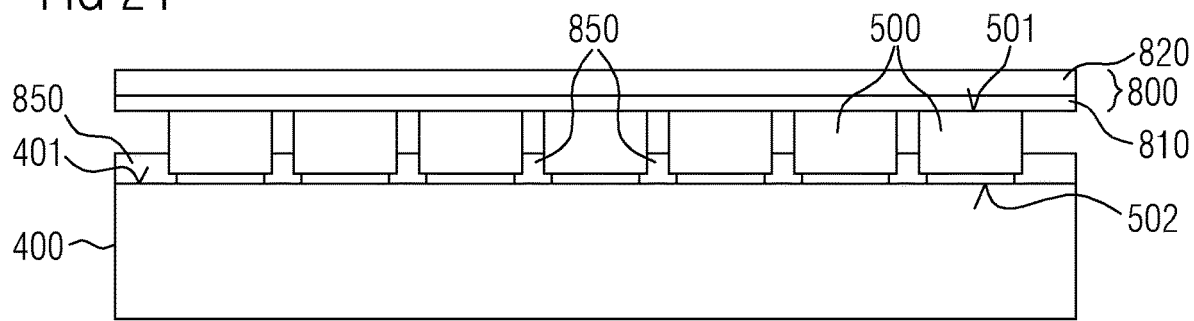
FIG. 24 schematically shows a sectional side view of the source carrier, the semiconductor chips and the film after the source carrier has cooled down.

FIG. 24 shows a schematically sectional side view of the source carrier 400 and the film 800 placed on the source carrier 400 with the semiconductor chips 500 arranged on it in a processing status following in time the representation of FIG. 23.

The source carrier 400 has been cooled to a temperature below the freezing point of water. For example, the source carrier 400 may have been cooled down to a temperature of −5° C. First, water 850 from the surroundings of the source carrier 400 is condensed on the upper side 401 and then frozen. For this purpose, the humidity in the vicinity of the source carrier 400 may have been set to a fixed value, for example, using a humidifier or dehumidifier and optionally a dew point sensor. The frozen water 850 condensed on the upper side 401 of the source carrier 400 next to and between the semiconductor chips 500 has fixed the semiconductor chips 500 on the source carrier 400.

Figure 25:
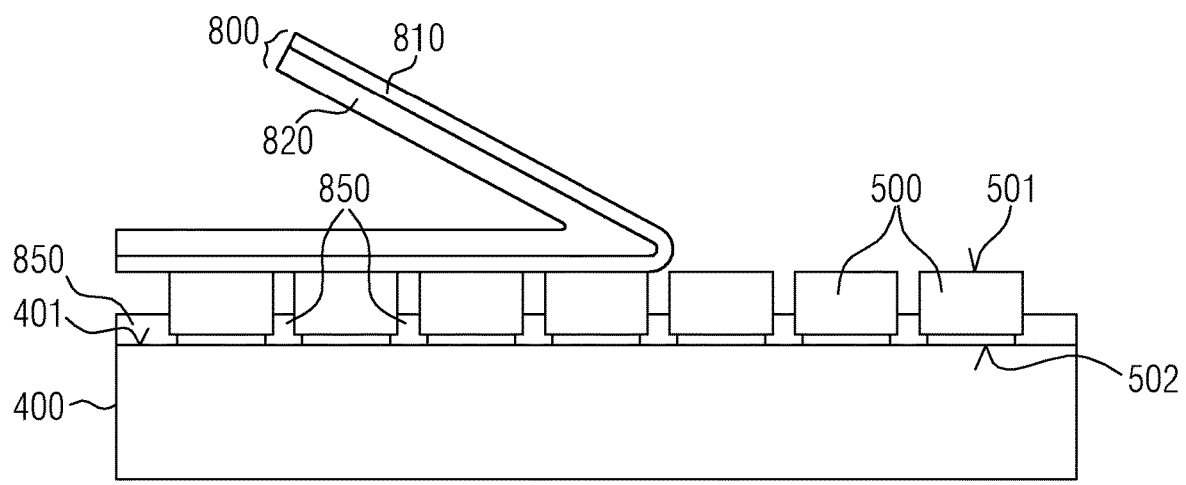
FIG. 25 schematically shows a sectional side view of the source carrier, the semiconductor chips and the film during removal of the film.

FIG. 25 shows a schematically sectional side view of the source carrier 400, the foil 800 and the semiconductor chip 500 fixed by the frozen water 850 on the upper side 401 of the source carrier 400 in a processing status following the representation of FIG. 24.

The film 800 is removed from the semiconductor chips 500 in the processing status shown in FIG. 25. The semiconductor chips 500 remain on the upper side 401 of the source carrier 400 due to their fixation by the frozen water 850. It is advisable to remove the foil 800 at an acute angle as shown schematically in FIG. 25. The connections between the semiconductor chips 500 and the adhesive film 810 of the film 800 are thus easily and reliably broken by the peeling forces.

Figure 26:
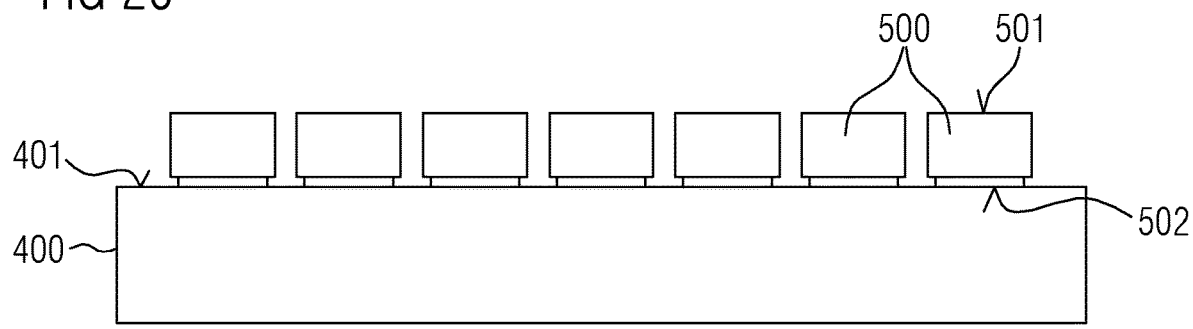
FIG. 26 schematically shows a sectional side view of the source carrier and the semiconductor chips after removing the foil and heating the source carrier.

FIG. 26 shows a schematically sectional side view of the source carrier 400 and the semiconductor chips 500 arranged on the upper side 401 of the source carrier 400 in a processing status following in time the representation of FIG. 25.

The film 800 has been completely removed. Subsequently, the source carrier 400 was heated above the dew point of the environment. For example, the source carrier 400 may have been heated to a temperature of 40° C. The previously frozen water 850 on the upper side 401 of the source carrier 400 was first melted and then evaporated. Thus the semiconductor chips 500 are now provided at the upper side 401 of the source carrier 400 to transfer them afterwards by the transfer tool 100 on the target carrier 600.

Figure 27:
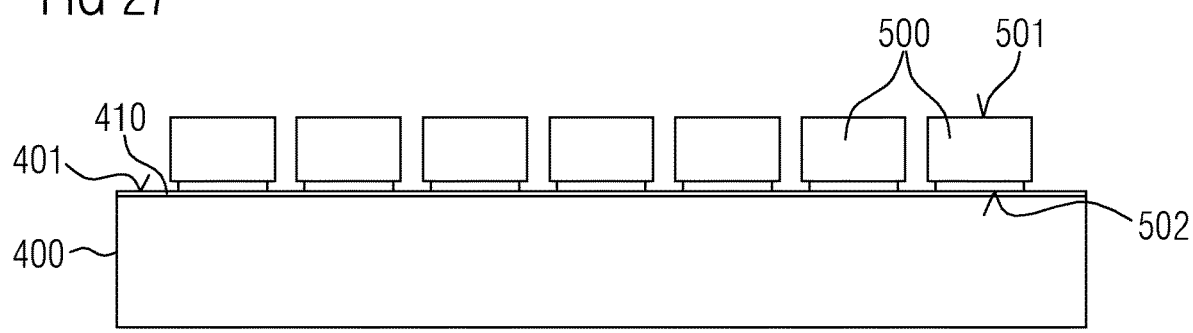
FIG. 27 schematically shows a sectional side view of the source beam according to another example.

FIG. 27 shows a schematically sectional side view of the source carrier 400 with the semiconductor chips 500 provided at the upper side 401 of the source carrier 400 according to a further example. In the example shown in FIG. 27, the upper side 401 of the source carrier 400 has a coating 410. The coating 410 may contain hardened silicone, polydimethylsiloxane (PDMS) or other sticky material. The adhesion of the coating 410 is less than 0.1 N/20 mm$^2$. The coating 410 can have a fixed roughness depth. For example, the coating 410 can have a roughness depth of more than 10 nm.

Figure 28:
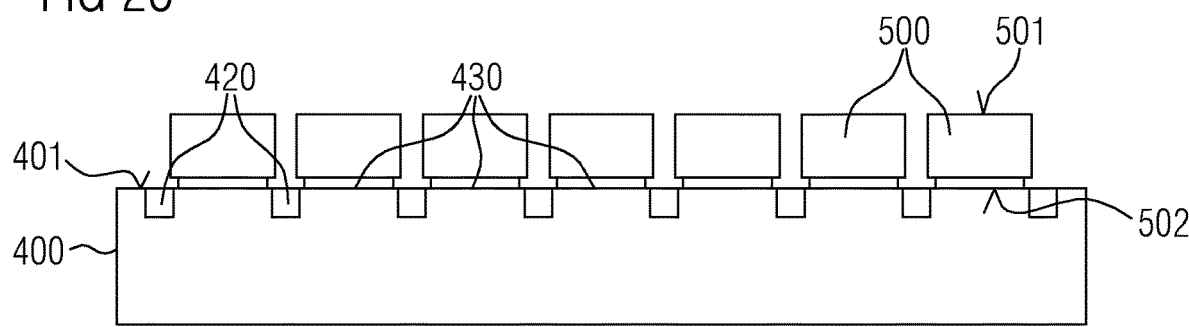
FIG. 28 schematically shows a sectional side view of the source beam according to another example.

FIG. 28 shows a schematically sectional side view of the source carrier 400 and the semiconductor chips 500 provided at the upper side 401 of the source carrier 400 according to a further example.

In the example shown in FIG. 28, the upper side 401 of the source carrier 400 has a structuring 420 that divides the upper side 401 into a regular arrangement of individual chip receiving areas 430. Structuring 420 can be formed by trenches arranged on the upper side 401 of the source carrier 400, for example.

Each of the chip receiving areas 430 defined by the structuring 420 is intended to hold a semiconductor chip 500. The chip receiving areas 430 form a regular row or matrix arrangement. In the method described above to provide the semiconductor chips 500 at the upper side 401 of the source carrier 400, the foil 800 with the arrangement of semiconductor chips 500 is placed on the source carrier 400 such that each semiconductor chip 500 is arranged on its own chip receiving area 430.

In the method above of providing the semiconductor chips 500 on the source carrier 400, the structuring 420 of the upper side 401 of the source carrier 400 during thawing and evaporation of the water 850 previously frozen on the upper side 401 of the source carrier 400 may prevent wetting forces from acting undefined and displacing the semiconductor chips 500 located on the upper side 401 of the source carrier 400. By subdividing the upper side 401 of the source carrier 400 into separate chip receiving areas 430, is possible that during the thawing and evaporation of the water 850 in each chip receiving area 430 individual and separate water drops are formed, which are not connected to the water drops of the neighboring chip receiving areas 430. The drops of water that form can thus produce a centering effect by which the semiconductor chips 500 arranged on the chip receiving areas 430 are centered on the 430 chip receiving areas.

The JIS Z0237 test method can be used, for example, to determine the adhesive force with which semiconductor chips adhere to a carrier. The semiconductor chips are laminated with a force of, for example, 2 kg and a speed of 5 mm/s, then delaminated with a speed of 300 mm/s at a pull-off angle of 180°. The film width is 20 mm.

This application claims priority of DE 102016221281.8, the subject matter of which is incorporated herein by reference.

Our methods and transfer tools are illustrated and described in more detail using preferred examples. Nevertheless, this disclosure is not limited to the disclosed examples. Rather, other variations can be derived by those skilled in the art without leaving the scope of protection of the appended claims.

The invention claimed is:

1. A method of transferring semiconductor chips comprising:
   providing a transfer tool having a plurality of segments, each segment having a liquid receiving area;
   providing a plurality of semiconductor chips in a regular array on a source carrier;
   providing a target carrier;
   selectively arranging liquid drops on the liquid receiving areas of some of the segments;
   causing the transfer tool to approach the source carrier, each liquid drop contacting and wetting a semiconductor chip;
   lifting the transfer tool from the source carrier, wherein semiconductor chips wetted by liquid drops are lifted from the source carrier by the transfer tool;
   causing the transfer tool to approach the target carrier such that the semiconductor chips arranged on the transfer tool contact the target carrier; and
   lifting the transfer tool from the target carrier, the semiconductor chips contacting the target carrier remaining on the target carrier.

2. The method according to claim 1, wherein the arrangement of the liquid drops is carried out at least partially in parallel.

3. The method according to claim 1, wherein the arrangement of the liquid drops on the liquid receiving areas is carried out by shooting, or the selective arrangement of the liquid drops comprises:
   selectively applying electrical charge to the liquid receiving areas of at least some of the segments; and
   immersing the liquid receiving areas in a polar liquid.

4. The method according to claim 3, wherein the selective application of electrical charge to the liquid receiving areas of at least some of the segments comprises:
   applying electrical charge to the liquid receiving areas of all segments of the transfer tool; and
   selectively removing the charge from some of the segments.

5. The method according to claim 1, further comprising, after the transfer tool approaches the source carrier:
   cooling the liquid receiving areas of at least the segments on which liquid drops have been arranged below a freezing point, wherein the liquid drops are at least partially frozen; and
   after the transfer tool approaches the target carrier heating the liquid receiving areas of at least the segments on which liquid drops have been arranged above the freezing point, wherein the liquid drops are at least partially thawed.

6. The method according to claim 1, further comprising, before lifting the transfer tool from the target carrier, removing the liquid drops.

7. The method according to claim 1, wherein the target carrier is provided with an attachment means disposed thereon, and the semiconductor chips disposed on the transfer tool contact the attachment means as the transfer tool approaches the target carrier.

8. The method according to claim 1, wherein providing the semiconductor chips on the source carrier comprises:
provliding a plurality of semiconductor chips in a regular array on a film;
providing the source carrier;
placing the film with the arrangement of semiconductor chips on the source carrier such that the semiconductor chips face the source carrier;
cooling the source carrier below the freezing point of water, wherein water condenses and freezes on the source carrier, and the semiconductor chips are fixed on the source carrier;
removing the film from the semiconductor chips, the semiconductor chips remaining on the source carrier; and
heating the source carrier, wherein water disposed on the source carrier melts and evaporates.

9. The method according to claim 8, wherein said film comprises a carrier film and an adhesive film disposed on said carrier film, and said semiconductor chips are disposed on said adhesive film.

10. The method according to claim 8, wherein the source carrier is provided with a structured upper side with chip receiving areas delimited from each other, and the film with the arrangement of semiconductor chips is disposed on the source carrier such that each semiconductor chip is arranged on its own chip receiving area.

* * * * *